(12) United States Patent
Tobita et al.

(10) Patent No.: US 7,825,888 B2
(45) Date of Patent: Nov. 2, 2010

(54) SHIFT REGISTER CIRCUIT AND IMAGE DISPLAY APPARATUS CONTAINING THE SAME

(75) Inventors: Youichi Tobita, Tokyo (JP); Hiroyuki Murai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 925 days.

(21) Appl. No.: 11/670,133

(22) Filed: Feb. 1, 2007

(65) Prior Publication Data

US 2007/0195053 A1    Aug. 23, 2007

(30) Foreign Application Priority Data

Feb. 23, 2006   (JP)   .............................. 2006-046339
Oct. 3, 2006    (JP)   .............................. 2006-271554

(51) Int. Cl.
    *G09G 3/36*   (2006.01)
(52) U.S. Cl. ......................................... 345/100; 377/64
(58) Field of Classification Search ................... 345/98, 345/99, 100; 377/64, 77; 365/78
    See application file for complete search history.

(56) References Cited

U.S. PATENT DOCUMENTS

| | | | |
|---|---|---|---|
| 5,434,899 A | | 7/1995 | Huq et al. |
| 5,517,543 A | | 5/1996 | Schleupen et al. |
| 5,949,398 A | * | 9/1999 | Kim ........................... 345/100 |
| 6,052,426 A | | 4/2000 | Maurice |
| 6,621,886 B2 | | 9/2003 | Kawahata |
| 6,845,140 B2 | | 1/2005 | Moon et al. |
| 7,023,410 B2 | | 4/2006 | Lee et al. |
| 7,038,653 B2 | * | 5/2006 | Moon ........................... 345/100 |
| 7,106,292 B2 | * | 9/2006 | Moon ........................... 345/100 |
| 7,173,676 B2 | * | 2/2007 | Jeon et al. ..................... 349/48 |
| 7,289,096 B2 | * | 10/2007 | Jeon et al. ................... 345/100 |
| 7,292,218 B2 | | 11/2007 | Lin et al. |

(Continued)

FOREIGN PATENT DOCUMENTS

JP          8-87897         4/1996

(Continued)

OTHER PUBLICATIONS

U.S. Appl. No. 11/937,791, filed Nov. 9, 2007, Tobita.

(Continued)

*Primary Examiner*—Richard Hjerpe
*Assistant Examiner*—Tom V Sheng
(74) *Attorney, Agent, or Firm*—Oblon, Spivak, McClelland, Maier & Neustadt, L.L.P.

(57) ABSTRACT

A shift register circuit comprises a first transistor between a gate line output terminal and a clock terminal, a second transistor between the gate line output terminal and a first power supply terminal, a third transistor between a carry signal output terminal and the clock terminal and a fourth transistor between the carry signal output terminal and the first power supply terminal. Gates of the second and fourth transistors are connected to each other. A fifth transistor connected between a gate of the first transistor and a second power supply terminal and a sixth transistor connected between a gate of the third transistor and the second power supply terminal have gates both of which are connected to an input terminal. With this constitution, it is possible to suppress an influence between two synchronous output signals outputted from the shift register circuit.

25 Claims, 18 Drawing Sheets

U.S. PATENT DOCUMENTS

| | | | |
|---|---|---|---|
| 7,327,338 B2* | 2/2008 | Moon | 345/87 |
| 7,369,111 B2* | 5/2008 | Jeon et al. | 345/100 |
| 2006/0001637 A1 | 1/2006 | Pak et al. | |
| 2006/0109230 A1* | 5/2006 | An et al. | 345/98 |

FOREIGN PATENT DOCUMENTS

| | | |
|---|---|---|
| JP | 10-500243 | 1/1998 |
| JP | 2001-52494 | 2/2001 |
| JP | 2002-133890 | 5/2002 |
| JP | 2004-78172 | 3/2004 |
| JP | 2005-522734 | 7/2005 |
| JP | 2006-24350 | 1/2006 |

OTHER PUBLICATIONS

U.S. Appl. No. 11/614,384, filed Dec. 21, 2006, Tobita.
U.S. Appl. No. 11/624,117, filed Jan. 19, 2007, Tobita.
U.S. Appl. No. 11/676,866, filed Feb. 20, 2007, Tobita.
U.S. Appl. No. 11/838,416, filed Aug. 14, 2007, Tobita, et al.
U.S. Appl. No. 11/831,131, filed Jul. 31, 2007, Tobita.
U.S. Appl. No. 12/647,108, filed Dec. 24, 2009, Tobita.

* cited by examiner

F I G . 3
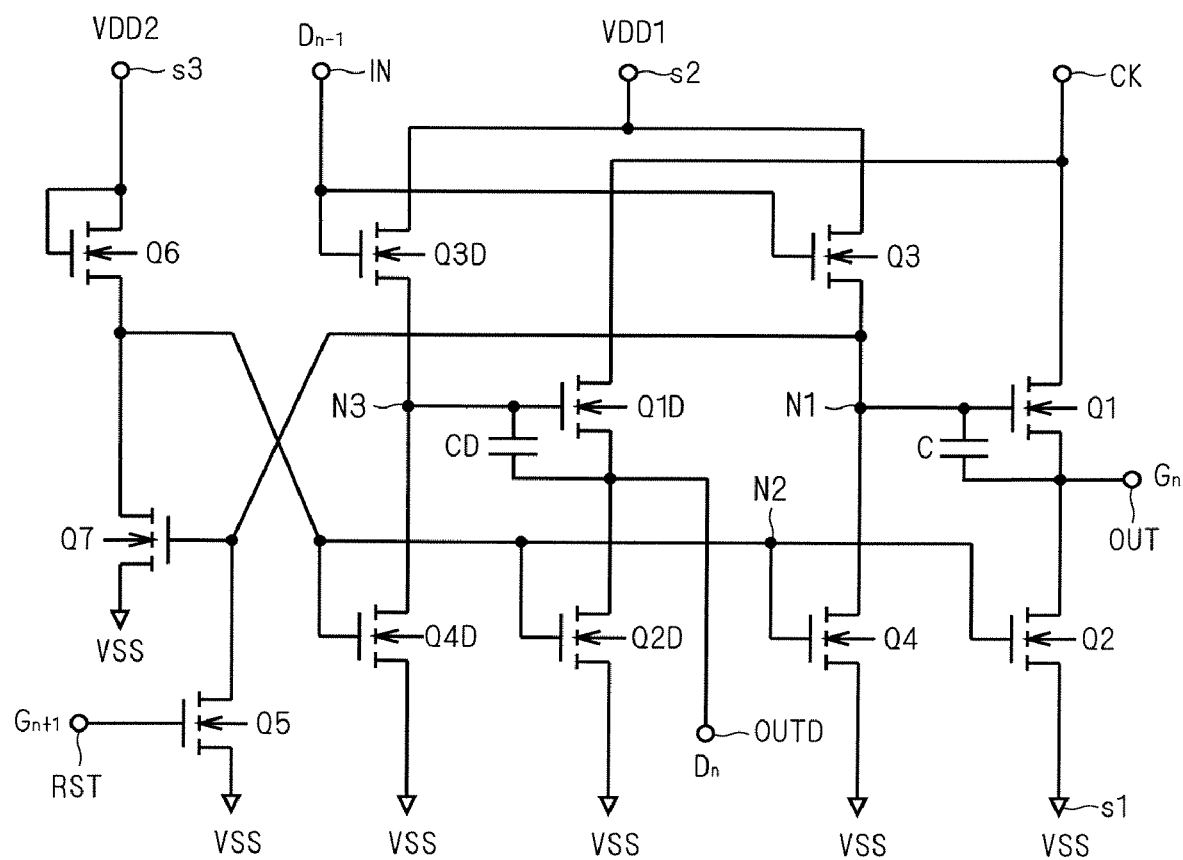

F I G . 6
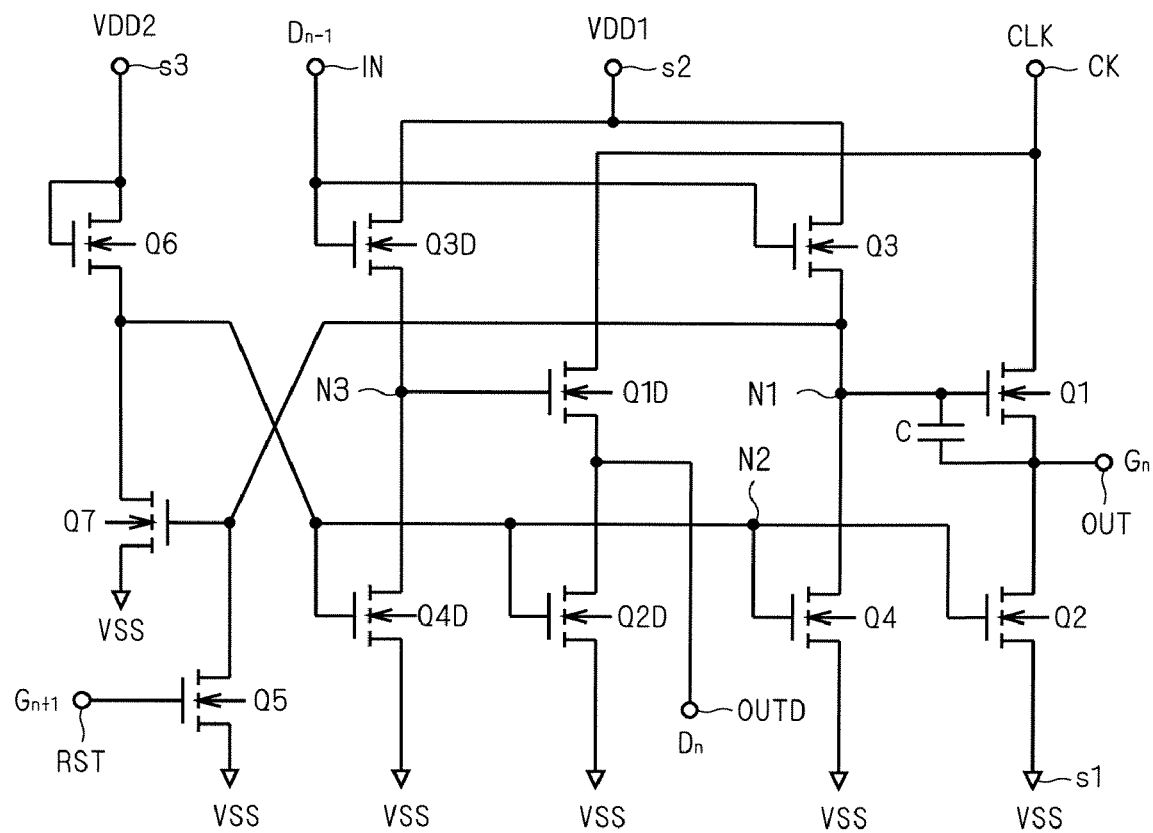

F I G . 1 1
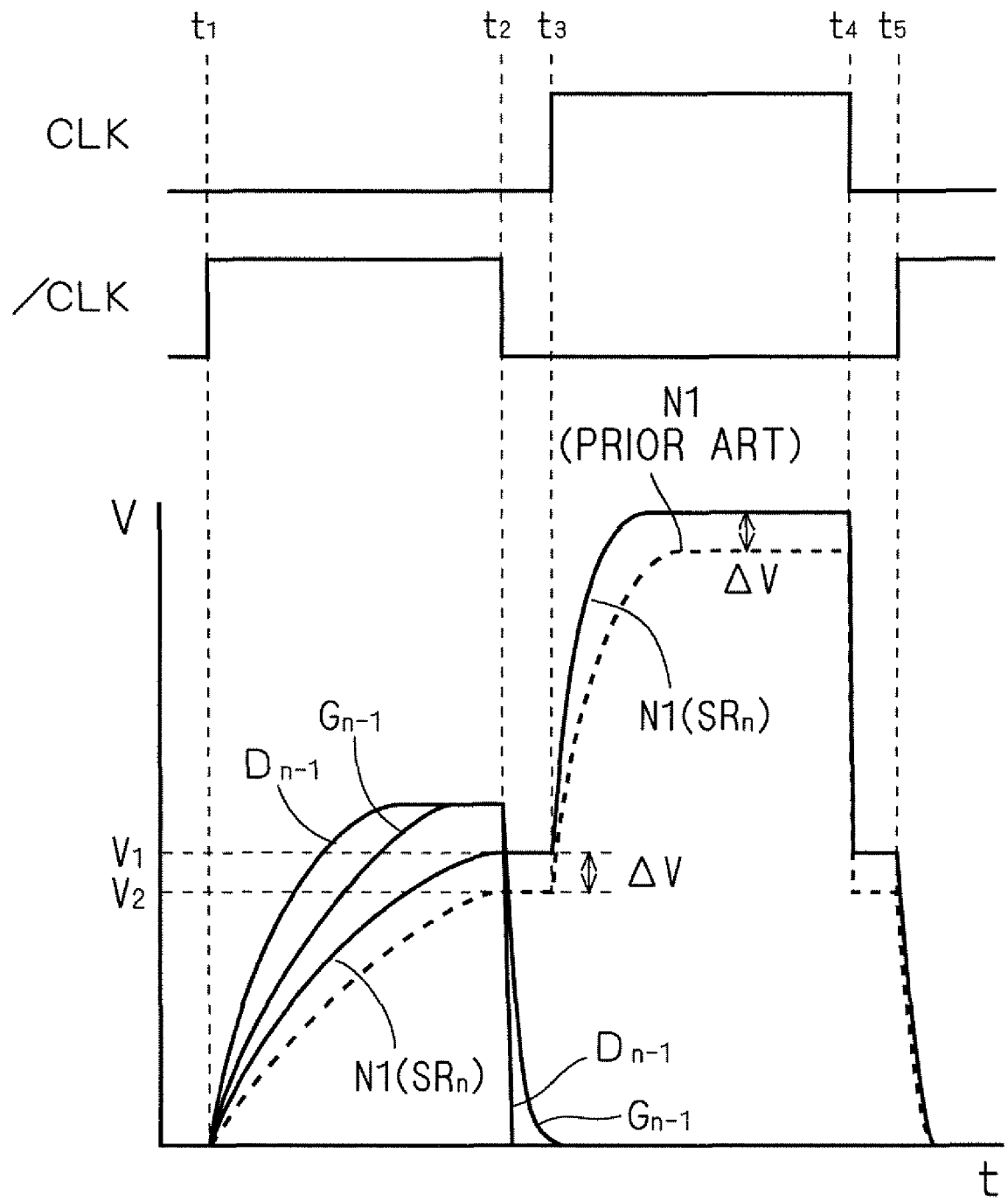

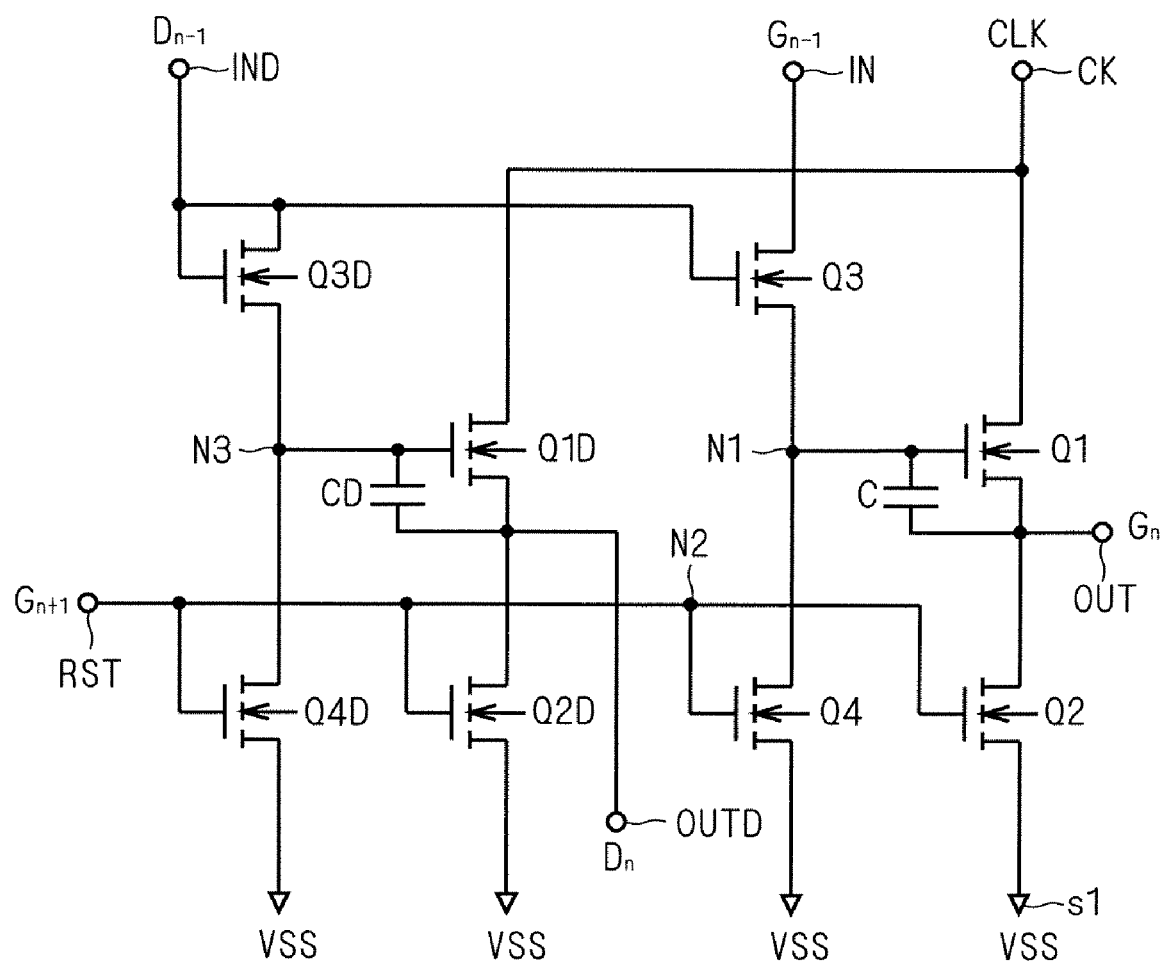
F I G . 1 2

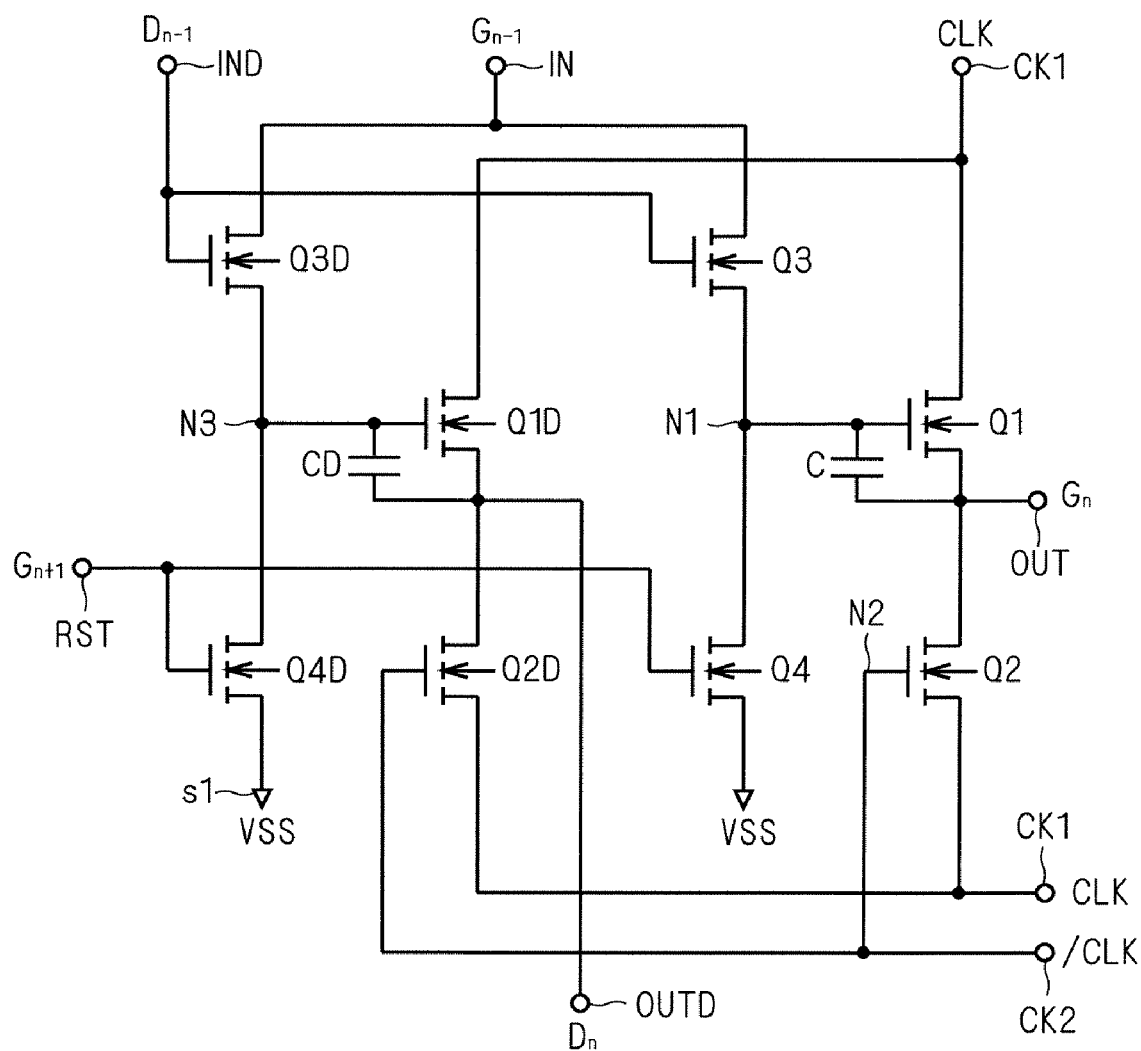
F I G . 1 4

F I G . 1 5
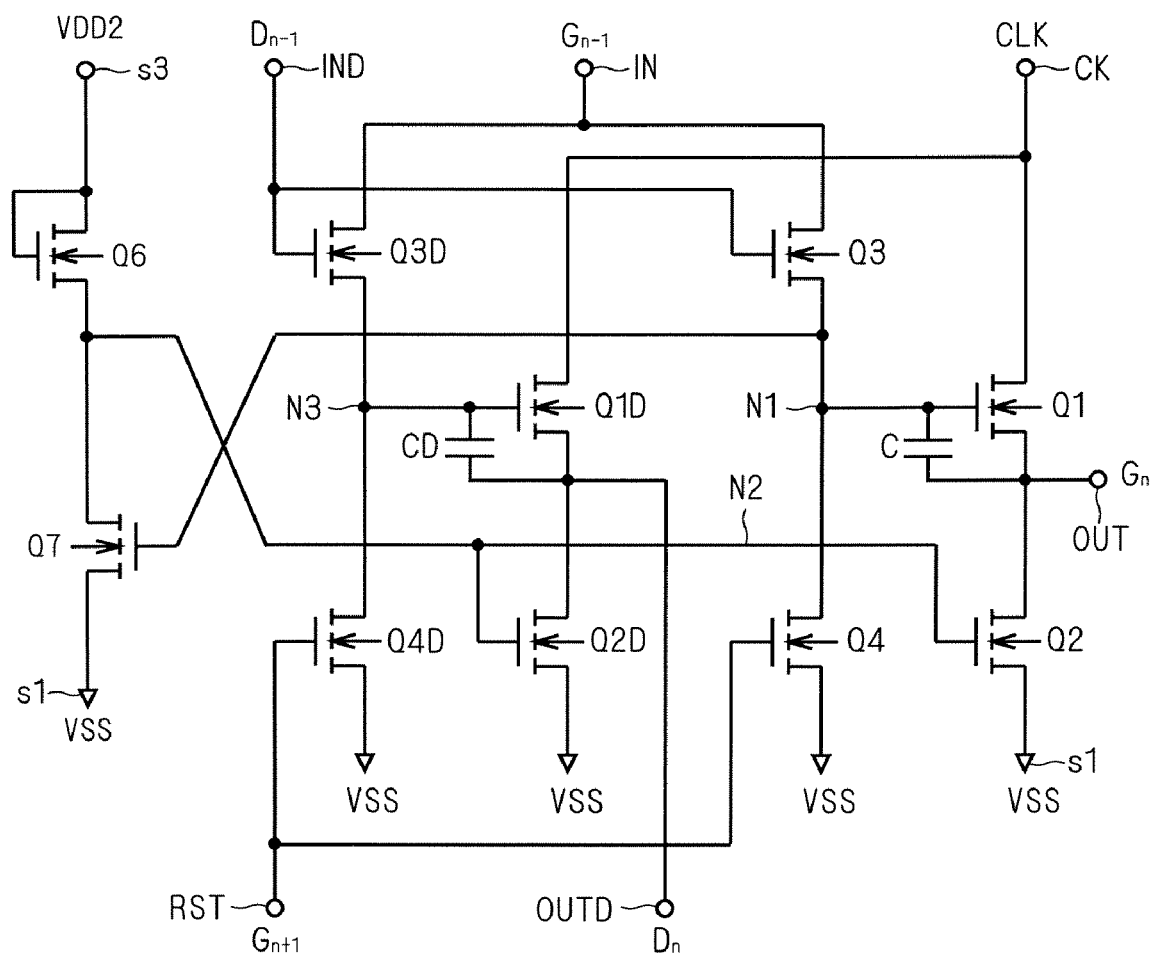

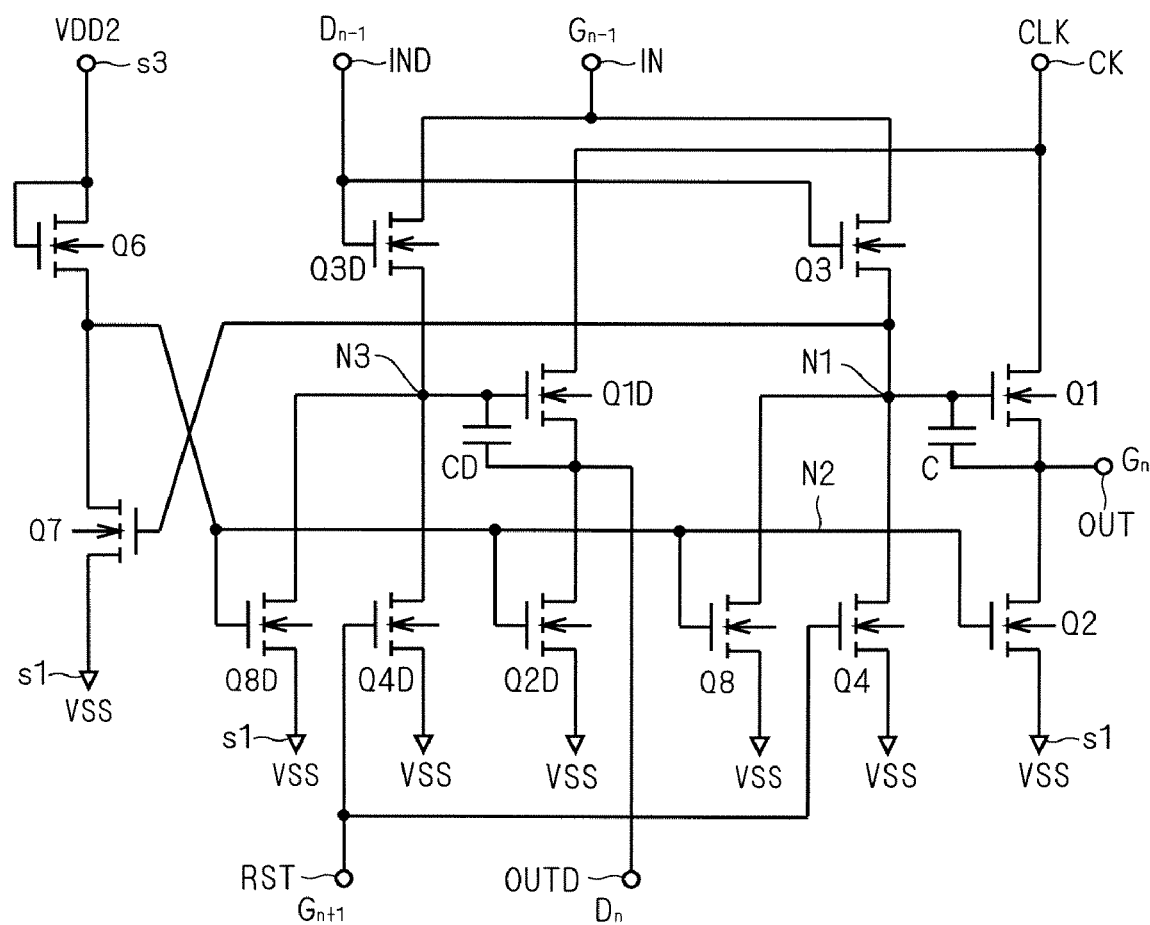
F I G . 1 6

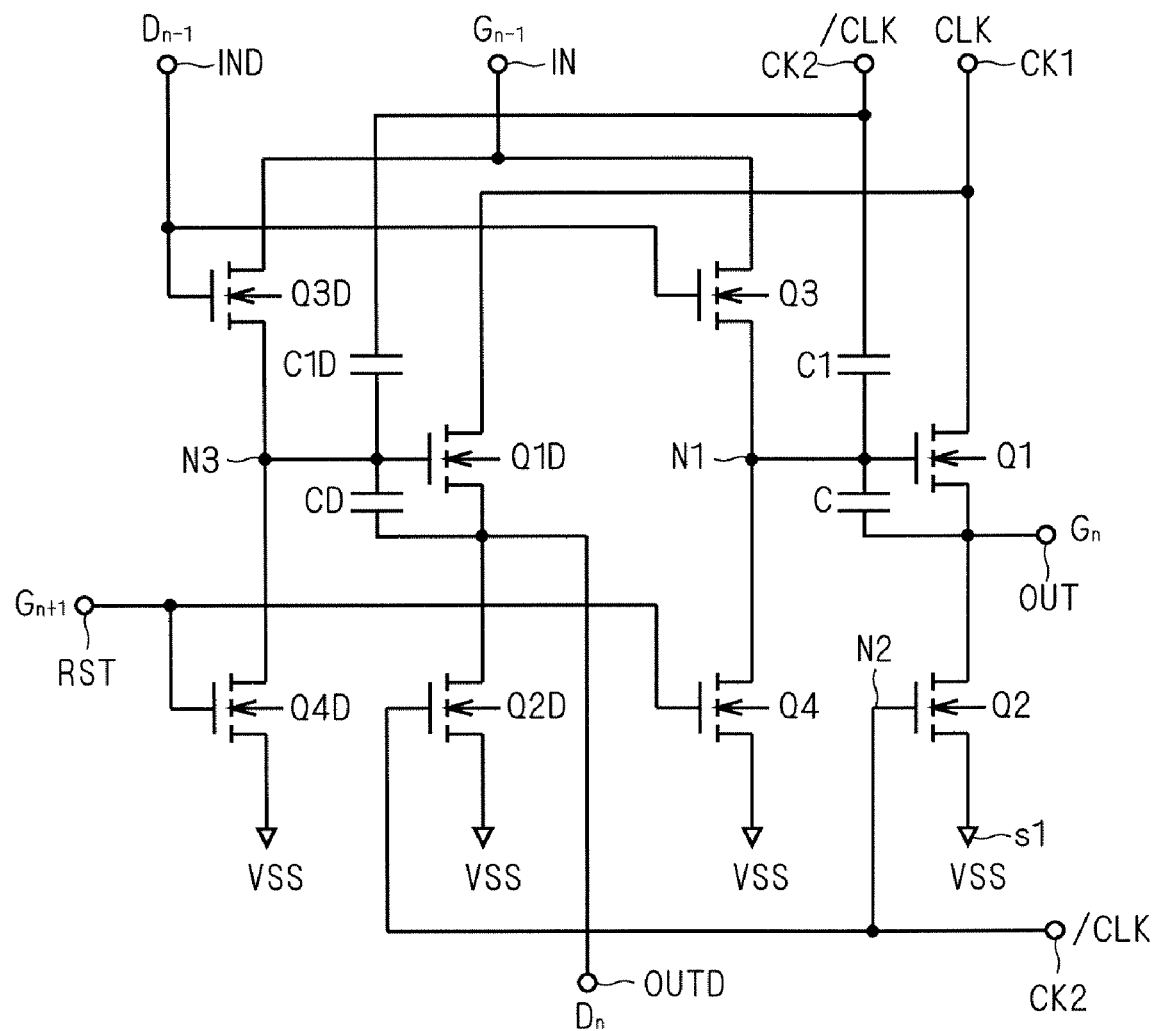
F I G . 1 7

F I G . 1 8
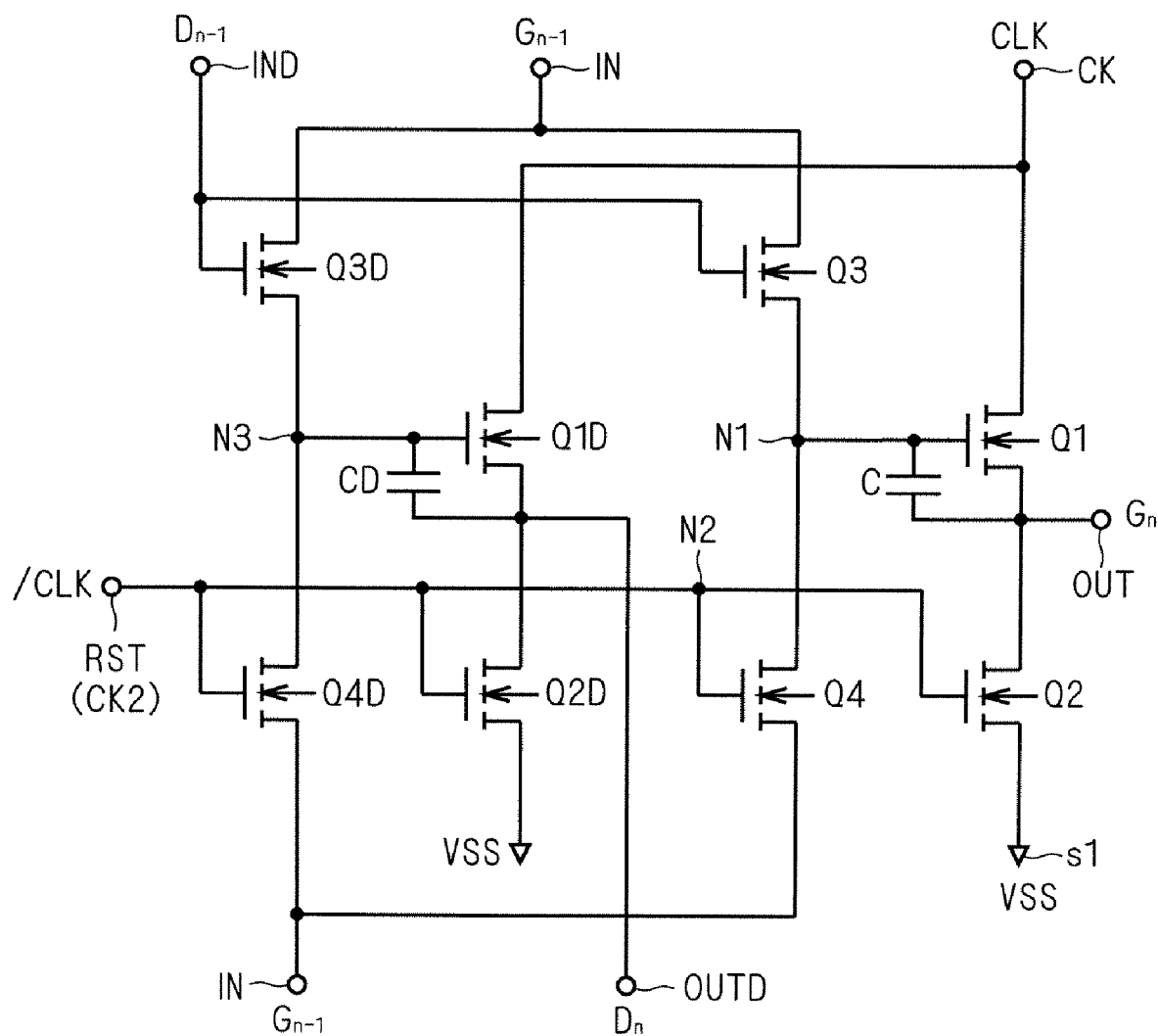

SHIFT REGISTER CIRCUIT AND IMAGE DISPLAY APPARATUS CONTAINING THE SAME

BACKGROUND OF THE INVENTION

1. Field of the Invention

The present invention relates to a shift register circuit, and more particularly to a shift register circuit used as a scanning-line driving circuit in an image display apparatus, or the like, which is formed only of field effect transistors of the same conductivity type.

2. Description of the Background Art

In an image display apparatus (hereinafter, referred to as "display apparatus") such as a liquid crystal display, a plurality of pixels are arranged in a matrix in a display panel and a gate line (scanning line) is provided for each row of pixels (pixel line) in the display panel. In a cycle of one horizontal period of a display signal, the gate lines are sequentially selected and driven, to update a displayed image. As a gate line driving circuit (scanning-line driving circuit) for sequentially selecting and driving the pixel lines, i.e., the gate lines, a shift register may be used, which performs a round of shift operation in one frame period of the display signal.

In order to reduce the number of steps in a manufacturing process for a display apparatus, it is preferable that the shift register used as the gate line driving circuit should be formed only of field effect transistors of the same conductivity type. Therefore, various types of shift registers formed only of N-type or P-type field effect transistors and display apparatuses containing such shift registers have been proposed (e.g., Japanese Patent Application Laid Open Gazette Nos. 2004-78172 and 8-87897 (Patent Documents 1 and 2)). As a field effect transistor, a MOS (Metal Oxide Semiconductor) transistor, a TFT (Thin Film Transistor) or the like is used.

Other references are Japanese Patent Application Laid Open Gazette Nos. 10-500243, 2001-52494 and 2002-133890 (Patent Documents 3, 4 and 5).

A shift register as a gate line driving circuit consists of a plurality of cascaded shift register circuits each of which is provided for one pixel line, i.e., one gate line. In this specification, for simple discussion, each of a plurality of shift register circuits which form a gate line driving circuit is referred to as a "unit shift register".

In a background-art gate line driving circuit, unit shift registers are connected in cascade with an output terminal of each unit shift register is connected to an input terminal of its succeeding-stage unit shift register. Specifically, a unit shift register needs to drive not only a gate line but also the succeeding-stage unit shift register by using an output signal, and therefore, to an output terminal of each unit shift register, both the gate line which is thereby driven and an input terminal of the succeeding-stage unit shift register are connected (see, e.g., FIG. 5 of Patent Document 1). With this constitution, however, a load on the gate line exerts an influence upon the input terminal of the succeeding-stage unit shift register, to thereby cause a delay in an output signal. The signal delay increases as the stage becomes posterior in the cascade connection, and sometimes, this eventually causes a problem in display.

On the other hand, a unit shift register shown in FIG. 12 of Patent Document 1 has a constitution in which an output signal (gate line driving signal) for driving a gate line and an output signal (carry signal) for driving the succeeding-stage unit shift register are outputted from individual output terminals by using individual transistors. This reduces an influence that the load on the gate line exerts upon an input terminal of the succeeding-stage unit shift register and therefore alleviates the above problem.

In the unit shift register of Patent Document 1, though a transistor (transistor M1 in FIG. 12 of Patent Document 1) for activating a gate line driving signal and a transistor (transistor TR1 in the same figure) for activating a carry signal are separately provided, gates (control electrodes) of these two transistors are connected to the same node (node N1 of the same figure). The gate of the transistor for activating the gate line driving signal is stepped up at the rise of the gate line driving signal by the coupling of gate-channel capacitance of the transistor and a capacitive element (capacitor C of the same figure) connected between a gate and a source of the transistor. Therefore, in the shift register of Patent Document 1, a gate of the transistor for activating the carry signal is also stepped up at the rise of the gate line driving signal. As a result, an influence of the gate line driving signal is exerted upon the carry signal.

For this reason, when the rising speed of the gate line driving signal becomes lower due to variations in ambient temperature, threshold voltage of a transistor or the like, the rising speed of the carry signal accordingly becomes lower and this disadvantageously makes it difficult to perform a high-speed operation.

SUMMARY OF THE INVENTION

It is an object of the present invention to achieve a faster operation of a shift register circuit which is capable of individually outputting a signal (carry signal) for driving another shift register circuit and a signal (gate line driving signal) for driving a gate line, by suppressing an influence between the two signals.

The present invention is intended for a shift register circuit. According to the present invention, the shift register circuit includes a first clock terminal, first and second output terminals and first to fourth transistors. The first transistor supplies a first clock signal inputted to the first clock terminal to the first output terminal. The second transistor discharges the first output terminal. The third transistor supplies the first clock signal to the second output terminal. The fourth transistor discharges the second output terminal. The shift register circuit of the present invention further includes a first driving circuit connected to a control electrode of the first transistor, for driving the first transistor and a second driving circuit connected to a control electrode of the third transistor, for driving the third transistor. In the shift register circuit of the present invention, the first driving circuit and the second driving circuit perform charge/discharge of the control electrode of the first transistor and charge/discharge of the control electrode of the third transistor, respectively, at the same timing.

In the shift register circuit of the present invention, though the level of the control electrode of the first transistor and that of the control electrode of the second transistor change almost similarly, these transistors are charged/discharged by the individual driving circuits (the first and second driving circuits). The control electrode of the first transistor is stepped up at the rise of the level of the first output terminal and the control electrode of the third transistor is stepped up at the rise of the level of the second output terminal. Therefore, even if a delay is caused in either of signals of the first and second output terminals, the delay exerts no influence upon the other signal.

It is assumed, for example, that a plurality of shift register circuits of this present invention are connected in cascade to form a gate line driving circuit of a display apparatus. When a signal of the first output terminal of each shift register circuit drives a gate line and a signal of the second output terminal drives another shift register circuit, even if a delay is caused in the signal of the first output terminal by a load on the gate line, the speed of the second output signal can be maintained. It is therefore possible to ensure a faster operation of the gate line driving circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram showing a configuration of a unit shift register in accordance with the first preferred embodiment;

FIG. 6 is a circuit diagram showing a configuration of a unit shift register in accordance with a second preferred embodiment;

FIG. 11 is a graph showing an effect of the unit shift register in accordance with the third preferred embodiment;

FIG. 12 is a circuit diagram showing a variation of the third preferred embodiment;

FIG. 14 is a circuit diagram showing a configuration of a unit shift register in accordance with a fifth preferred embodiment;

FIG. 15 is a circuit diagram showing a configuration of a unit shift register in accordance with a sixth preferred embodiment;

FIG. 16 is a circuit diagram showing a configuration of a unit shift register in accordance with a seventh preferred embodiment;

FIG. 17 is a circuit diagram showing a configuration of a unit shift register in accordance with an eighth preferred embodiment; and FIG. 18 is a circuit diagram showing a configuration of a unit shift register in accordance with a ninth preferred embodiment.

DESCRIPTION OF THE PREFERRED EMBODIMENTS

Figure 1:
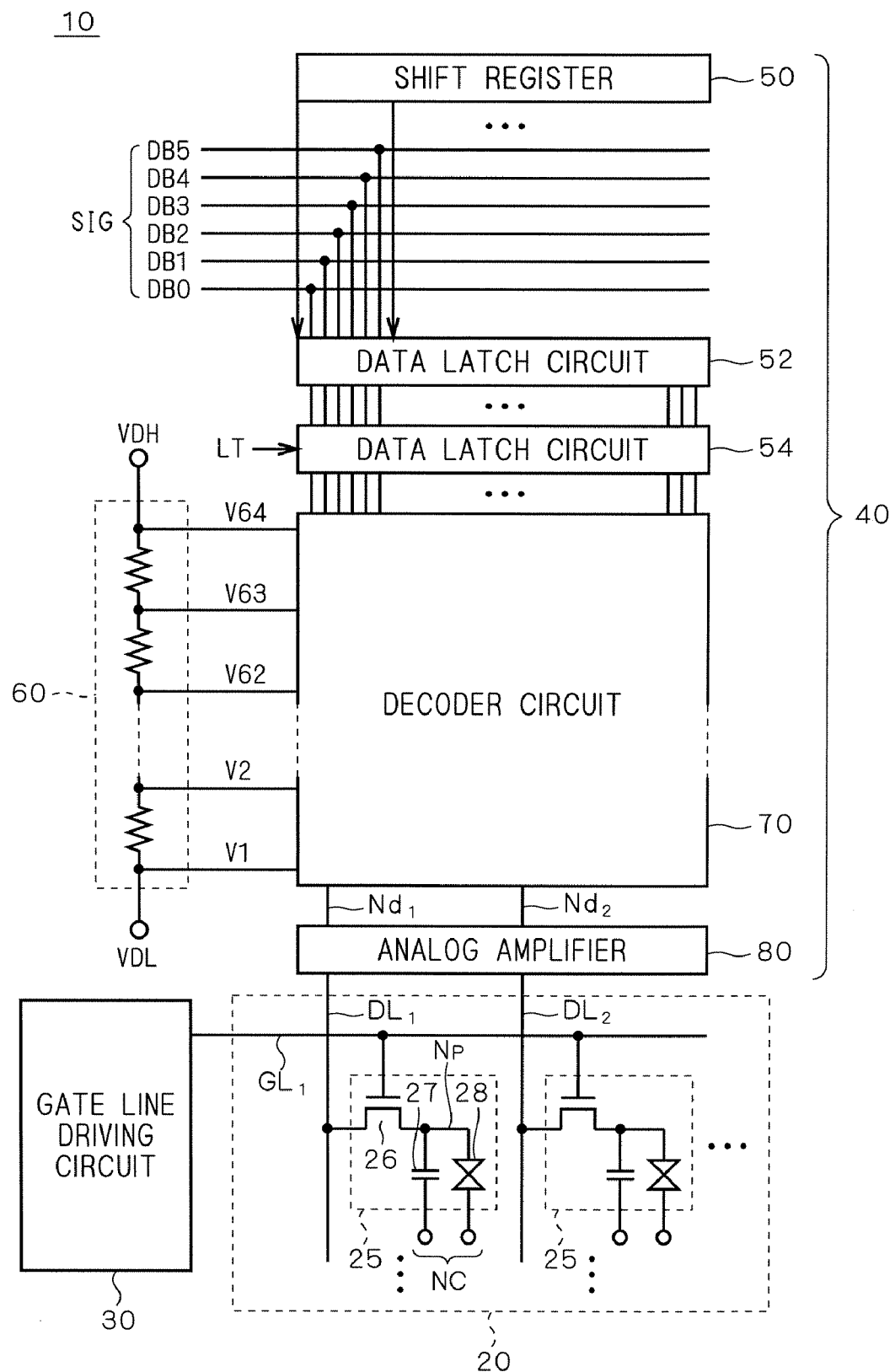
FIG. 1 is a schematic block diagram showing a constitution of a display apparatus in accordance with preferred embodiments of the present invention.

Preferred embodiments of the present invention will be discussed hereinbelow, referring to the accompanied drawings. To avoid repeated and redundant description, elements having the same or corresponding functions are represented by the same reference signs in the drawings.

The First Preferred Embodiment

FIG. 1 is a schematic block diagram showing a constitution of a display apparatus in accordance with the first preferred embodiment of the present invention. As a typical example of the display apparatus, in FIG. 1, an overall constitution of a liquid crystal display 10 is shown.

The liquid crystal display 10 comprises a liquid crystal array part 20, a gate line driving circuit (scanning-line driving circuit) 30 and a source driver 40. As will be described later explicitly, a shift register of the first preferred embodiment is mounted on the gate line driving circuit 30.

The liquid crystal array part 20 includes a plurality of pixels 25 which are arranged in a matrix. Rows of the pixels (hereinafter, also referred to as "pixel lines") are provided with gate lines $GL_1$, $GL_2$, . . . (hereinafter, also generically referred to as "gate lines GL"), respectively, and columns of the pixels (hereinafter, also referred to as "pixel columns") are provided with data lines $DL_1$, $DL_2$, . . . (hereinafter, generically referred to as "data lines DL"), respectively. FIG. 1 representatively shows the pixels 25 of the first and second columns in the first row and the corresponding gate line $GL_1$ and the corresponding data lines $DL_1$ and $DL_2$.

Each pixel 25 has a pixel switching element 26 disposed between the corresponding data line DL and pixel node Np, and a capacitor 27 and a liquid crystal display element 28 which are connected in parallel between the pixel node Np and a common electrode node NC. The crystal orientation of the liquid crystal display element 28 changes in accordance with the potential difference between the pixel node Np and the common electrode node NC, and in response to this change, the display luminance of the liquid crystal display element 28 changes. It thereby becomes possible to control the luminance of each pixel by a display voltage transmitted to the pixel node Np through the data line DL and the pixel switching element 26. In other words, an intermediate potential difference between a potential difference corresponding to the maximum luminance and a potential difference corresponding to the minimum luminance is applied between the pixel node Np and the common electrode node NC, to thereby obtain halftone luminance. Therefore, by setting the above display voltages stepwise, grayscale luminance can be obtained.

The gate line driving circuit 30 sequentially selects and drives the gate lines GL in a predetermined scanning cycle. Each pixel switching element 26 has a gate electrode connected to the corresponding gate line GL. While a certain gate line GL is selected, the pixel switching element 26 in each of the pixels 25 connected to the selected gate line GL is brought into the conducting state, to thereby connect the pixel node Np to the corresponding data line DL. Then, the display voltage transmitted to the pixel node Np is held by the capacitor 27. In general, the pixel switching element 26 is a TFT which is formed on an insulator substrate (a glass substrate, a resin substrate or the like) on which the liquid crystal display element 28 is also formed.

The source driver 40 is provided to output the display voltages which are set stepwise by a display signal SIG which is an N-bit digital signal, to the data lines DL. As an example, the display signal SIG is assumed to be a 6-bit signal including display signal bits DB0 to DB5. With such a 6-bit display signal SIG, $2^6$ (=64) levels of gray can be displayed in each pixel. Further, by forming one color display unit using three pixels of R (Red), G (Green) and B (Blue), a display of approximately 260 thousand colors can be achieved.

As shown in FIG. 1, the source driver 40 includes a shift register 50, data latch circuits 52 and 54, a gradation voltage generating circuit 60, a decoder circuit 70 and an analog amplifier 80.

In the display signal SIG, the display signal bits DB0 to DB5 for the display luminance of each pixel 25 are serially generated. In other words, the display signal bits DB0 to DB5 at each timing indicate the display luminance of one pixel 25 in the liquid crystal array part 20.

The shift register 50 gives an instruction to the data latch circuit 52 to capture the display signal bits DB0 to DB5 in synchronization with a cycle in which the setting of the display signal SIG is changed. The data latch circuit 52 sequentially captures serially-generated display signals SIG to latch the display signals SIG for one pixel line.

A latch signal LT inputted to the data latch circuit 54 is activated at th timing when the display signals SIG for one pixel line are captured by the data latch circuit 52. In response to this, the data latch circuit 54 captures the display signals SIG for one pixel line which are latched by the data latch circuit 52 at that time.

The gradation voltage generating circuit 60 consists of 63 resistor dividers which are connected in series between a high voltage VDH and a low voltage VDL, for generating 64 levels of gradation voltages V1 to V64, respectively.

The decoder circuit 70 decodes the display signals SIG latched by the data latch circuit 54, and on the basis of the result of decoding, selects voltages to be outputted to decoder output nodes $Nd_1$, $Nd_2$, . . . (generically referred to as "decoder output nodes Nd"), respectively, out of the gradation voltages V1 to V64 and outputs the selected voltages.

As a result, the display voltages (selected out of the gradation voltages V1 to V64) corresponding to the display signals SIG for one pixel line, which are latched by the data latch circuit 54, are outputted to the decoder output nodes Nd at the same time (in parallel). FIG. 1 representatively shows the decoder output nodes $Nd_1$ and $Nd_2$ corresponding to the data line $DL_1$ of the first column and the data line $DL_2$ of the second column, respectively.

The analog amplifier 80 outputs analog voltages corresponding to the display voltages outputted from the decoder circuit 70 to the decoder output nodes $Nd_1$, $Nd_2$, . . . , to the data lines $DL_1$, $DL_2$, . . . , respectively.

The source driver 40 repeatedly outputs the display voltages corresponding to a series of display signals SIG to the data lines DL for one pixel line in a predetermined scanning cycle, and the gate line driving circuit 30 sequentially drives the gate lines $GL_1$, $GL_2$, . . . in synchronization with the scanning cycle, to thereby display an image on the basis of the display signals SIG on the liquid crystal array part 20.

Though FIG. 1 shows an exemplary constitution of the liquid crystal display 10 with the gate line driving circuit 30 and source driver 40 formed integrally with the liquid crystal array part 20, the gate line driving circuit 30 and source driver 40 may be provided as external circuits of the liquid crystal array part 20.

Figure 2:
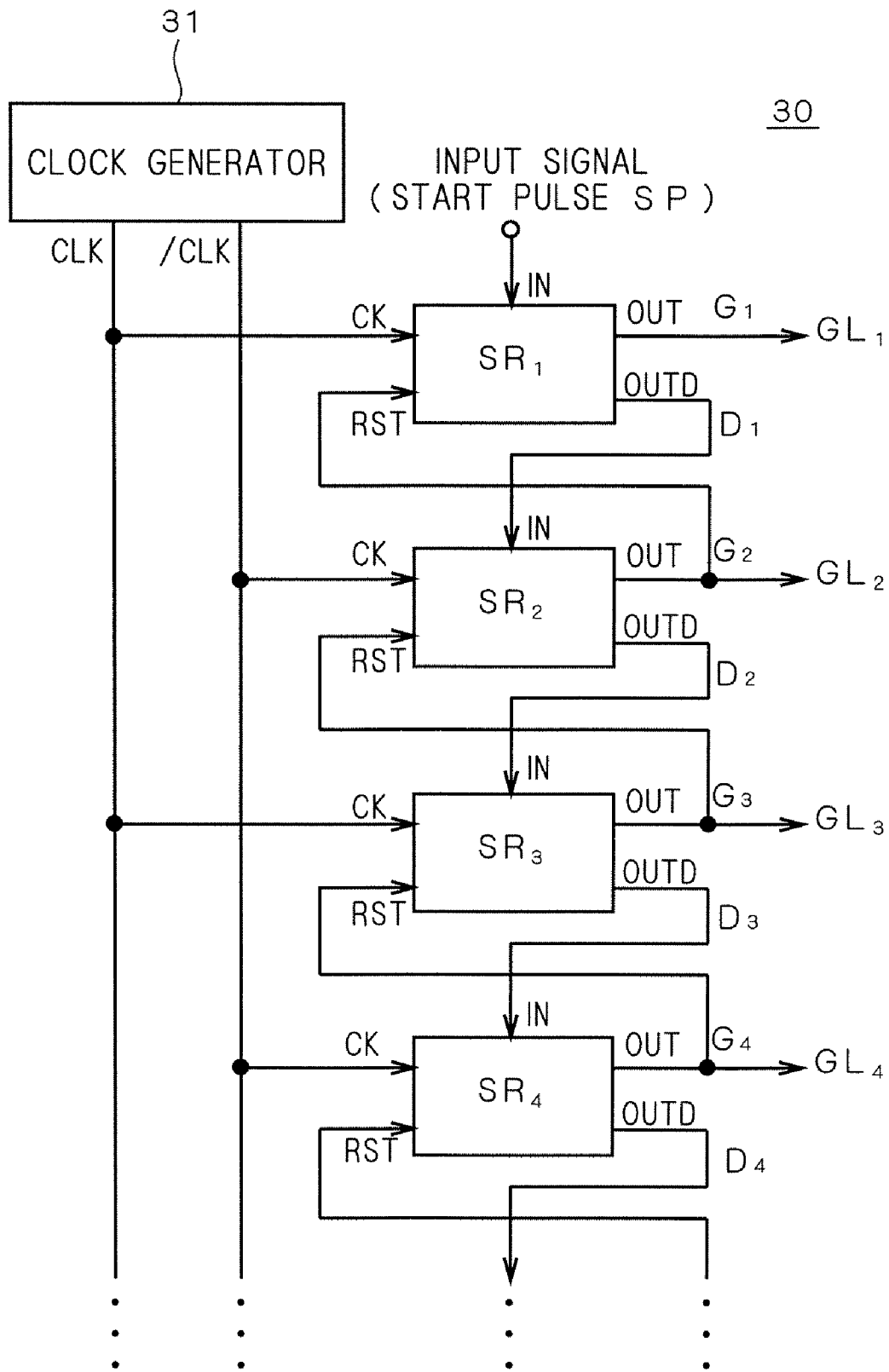
FIG. 2 is a block diagram showing a constitution of a gate line driving circuit in accordance with a first preferred embodiment.

FIG. 2 is a block diagram showing a constitution of the gate line driving circuit 30. The gate line driving circuit 30 consists of a plurality of shift register circuits $SR_1$, $SR_2$, $SR_3$, $SR_4$, . . . which are connected in cascade (for convenience of discussion, each of the cascaded shift register circuits $SR_1$, $SR_2$, . . . is generically be called a "unit shift register SR"). Each unit shift register SR is provided for one pixel line, i.e., one gate line GL.

A clock generator 31 shown in FIG. 2 is provided to input a two-phase clock consisting of two clock signals CLK and /CLK which are opposite to each other in phase to the unit shift registers SR of the gate line driving circuit 30. These clock signals CLK and /CLK are controlled to be alternately activated in synchronization with the scanning cycle of the display apparatus.

Each unit shift register SR has an input terminal IN, a clock terminal CK, a reset terminal RST and two output terminals OUT and OUTD. As shown in FIG. 2, either of the clock signals CLK and /CLK outputted from the clock generator 31 is supplied to the clock terminal CK of each unit shift register SR.

A start pulse SP corresponding to the start of each frame period of an image signal is inputted to the input terminal IN of the unit shift register $SR_1$ in the first stage as an input signal. To the input terminals IN of the unit shift registers SR in the second and following stages, the output terminals OUTD of their respective preceding-stage unit shift registers SR are connected. On the other hand, the output terminal OUT of each unit shift register SR is connected to the gate line GL and a signal therefrom is outputted to the gate line GL as a horizontal (or vertical) scanning pulse. Specifically, an output signal G from the output terminal OUT is a "gate line driving signal" for driving the gate line and an output signal D from the output terminal OUTD is a "carry signal" for driving the succeeding-stage unit shift register SR. Hereinafter, the output terminal OUT is referred to as a "gate line output terminal" and the output terminal OUTD is referred to as a "carry signal output terminal".

In the gate line driving circuit 30 having the constitution of FIG. 2, each unit shift register SR shifts and transmits a signal inputted to the input terminal (the start pulse SP or the output signal outputted from its preceding stage) to the corresponding gate line GL and its succeeding-stage unit shift register SR in synchronization with the clock signals CLK and /CLK (an operation of the unit shift register SR will be discussed later in detail). As a result, a series of unit shift registers SR serve as a gate line driving unit for sequentially activating the gate lines GL at a timing based on the predetermined scanning cycle.

FIG. 3 is a circuit diagram showing a configuration of the unit shift register SR in accordance with the first preferred embodiment of the present invention. In the gate line driving circuit 30, since the unit shift registers SR which are connected in cascade have substantially the same configuration, the configuration of one unit shift register SR will be described below as a representative example. Further, transistors constituting the unit shift register SR are all field effect transistors of the same conductivity type, and the transistors are all assumed to be N-type TFTs in the present preferred embodiment. If the transistor is an N-type TFT, the transistor is in an active (ON) state when the gate is at a high (H) level and the transistor is in an inactive (OFF) state when the gate is at a low (L) level. If the transistor is a P-type transistor, these states are reversed.

Figure 4:
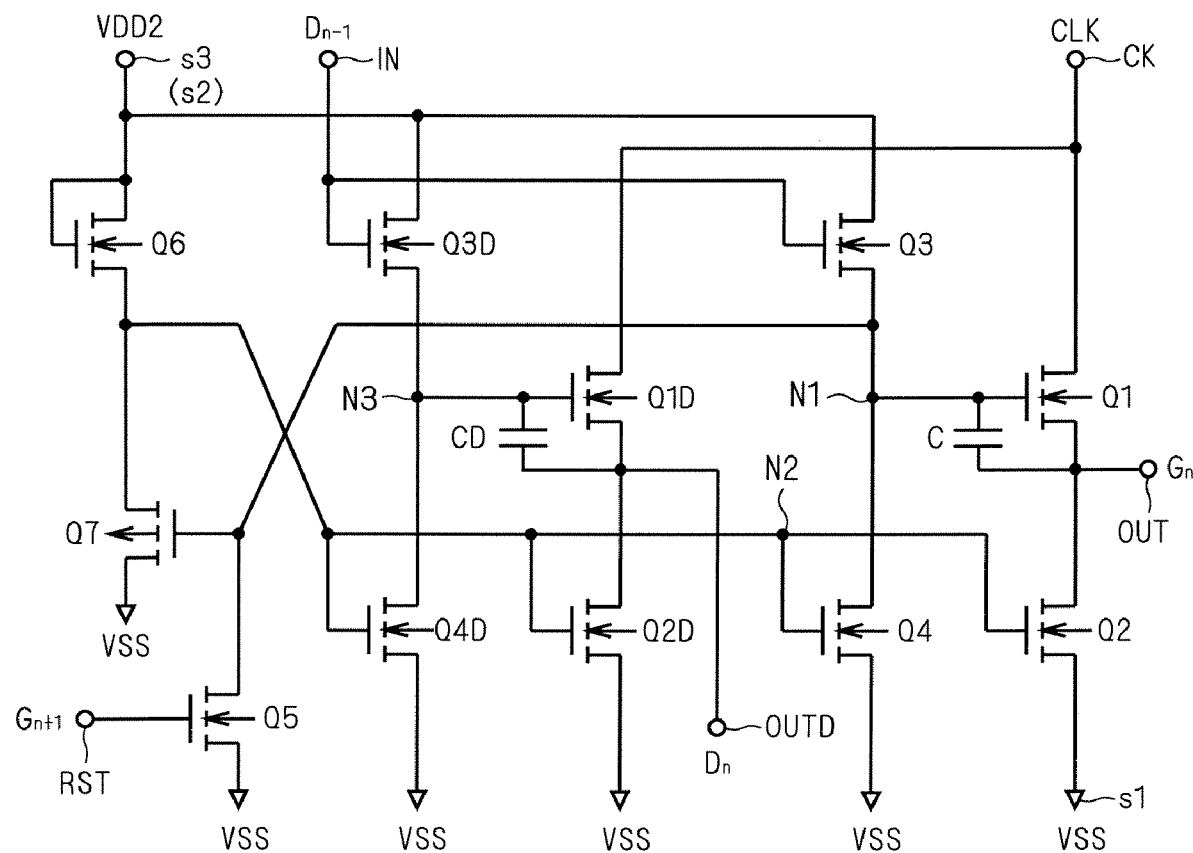
FIG. 4 is a circuit diagram showing a variation in configuration of the unit shift register in accordance with the first preferred embodiment.

As shown in FIG. 3, the unit shift register SR has a first power supply terminal s1 to which a low power supply potential VSS is supplied, and second and third power supply terminals s2 and s3 to which high power supply potentials VDD1 and VDD2 are supplied, respectively, in addition to the input terminal IN, the clock terminal CK, the reset terminal RST, the gate line output terminal OUT and the carry signal output terminal OUTD shown in FIG. 2. The high power supply potentials VDD1 and VDD2 may be at the same level. In such a case, as shown in FIG. 4, the second and third power supply terminals s2 and s3 may be formed of one terminal, and this reduces the area occupied by wires for power supply.

In the following discussion, the low power supply potential VSS is a reference potential of the circuit. In practical use, however, a reference potential is determined with reference to a voltage of data written into the pixels. For example, the high power supply potentials VDD1 and VDD2 may be set at 17V, and the low power supply potential VSS may be set at −12V.

As discussed earlier, the unit shift register SR of the present preferred embodiment has two output terminals, i.e., the gate line output terminal OUT for outputting the gate line driving signal and the carry signal output terminal OUTD for outputting the carry signal. An output stage for the gate line driving signal is constituted of a transistor Q1 connected between the gate line output terminal OUT and the clock terminal CK and a transistor Q2 connected between the gate line output terminal OUT and the first power supply terminal s1. Specifically, the transistor Q1 is the first transistor for supplying the clock signal inputted to the clock terminal CK to the gate line output terminal OUT (the first output terminal) and the transistor Q2 is the second transistor for supplying the potential of the first power supply terminal s1 to the gate line output terminal OUT to discharge the gate line output terminal OUT. An output stage for the carry signal is constituted of a transistor Q1D connected between the carry signal output terminal OUTD and the clock terminal CK and a transistor Q2D connected between the carry signal output terminal OUTD and the first power supply terminal s1. Specifically, the transistor Q1D is the third transistor for supplying the clock signal inputted to the clock terminal CK to the carry signal output terminal OUTD (the second output terminal) and the transistor Q2D is the fourth transistor for supplying the potential of the first power supply terminal s1 to the carry signal output terminal OUTD to discharge the carry signal output terminal OUTD. As shown in FIG. 3, the gate (control electrode) of the transistor Q2 and the gate of the transistor Q2D are connected to each other.

Herein, it is defined, as shown in FIG. 3, that a node to which a gate of the transistor Q1 is connected is a node N1 (the first node), a node to which the gates of the transistors Q2 and Q2D are connected is a node N2 (the second node) and a node to which a gate of the transistor Q1D is connected is a node N3 (the third node).

Between the gate and a source of the transistor Q1 (i.e., between the gate line output terminal OUT and the node N1), a step-up capacitor C (the first capacitive element) is provided. Further, between the node N1 and the second power supply terminal s2, a transistor Q3 (the fifth transistor) for supplying the potential of the second power supply terminal s2 to the node N1 is connected and its gate is connected to the input terminal IN. Between the node N1 and the first power supply terminal s1, a transistor Q4 (the sixth transistor) and a transistor Q5 (the ninth transistor) both for supplying the potential of the first power supply terminal s1 to the node N1 are connected. A gate of the transistor Q4, however, is connected to the node N2 and a gate of the transistor Q5 is connected to the reset terminal RST.

Therefore, the transistor Q3 so operates as to charge the node N1 in accordance with the level of the input terminal IN and the transistors Q4 and Q5 so operate as to discharge the node N1 in accordance with the levels of the node N2 and the reset terminal RST, respectively. In other words, these transistors Q3, Q4 and Q5 whose main electrodes (source/drain) are connected to the node N1 charge/discharge the control electrode of the transistor Q1, to form a pull-up driving circuit (the first driving circuit) for driving the transistor Q1 (i.e., the transistor for pull-up of the gate line output terminal OUT).

Between the gate and a source of the transistor Q1D (i.e., between the carry signal output terminal OUTD and the node N3), a step-up capacitor CD (the second capacitive element) is also provided. Further, between the node N3 and the second power supply terminal s2, a transistor Q3D (the seventh transistor) is connected and its gate is connected to the input terminal IN. Between the node N3 and the first power supply terminal s1, a transistor Q4D (the eighth transistor) is connected. A gate of the transistor Q4D is connected to the node N2.

Therefore, the transistor Q3D so operates as to charge the node N3 in accordance with the level of the input terminal IN and the transistors Q4D so operates as to discharge the node N1 in accordance with the level of the node N2. In other words, these transistors Q3D and Q4D whose main electrodes (source/drain) are connected to the node N3 charge/discharge the control electrode of the transistor Q3, to form a pull-up driving circuit (the second driving circuit) for driving the transistor Q1D (i.e., the transistor for pull-up of the carry signal output terminal OUTD).

Thus, in the unit shift register SR of the first preferred embodiment, the charge/discharge of the node N1 to drive transistor Q1 and the charge/discharge of the node N3 to drive transistor Q1D are performed by individual transistors.

Between the node N2 and the third power supply terminal s3, a diode-connected transistor Q6 is connected and between the node N2 and the first power supply terminal s1, a transistor Q7 is connected. A gate of the transistor Q7 is connected to the node N1.

The transistor Q7 is set to have a driving capability (capability of carrying current) sufficiently higher than that of the transistor Q6. In other words, the transistor Q7 has an on-state resistance sufficiently lower than that of the transistor Q6. Therefore, as the gate potential of the transistor Q7 rises, the node N2 falls in potential, and as the gate potential of the transistor Q7 falls, the node N2 rises in potential. Specifically, the transistors Q6 and Q7 constitute a ratio inverter whose operation is defined by the ratio between their on-state resistance values. This inverter uses the node N1 as its input end and the node N2 as its output end and forms a "pull-down driving circuit" which drives the transistors Q2 and Q2D for pulling down the gate line output terminal OUT and the carry signal output terminal OUTD.

A specific operation of the unit shift register SR shown in FIG. 3 will now be discussed. Since the respective unit shift registers SR constituting the gate line driving circuit 30 operate substantially in the same manner, an operation of one unit shift register SR will be discussed as a representative example. For simple discussion, it is assumed that the clock signal CLK is inputted to the clock terminal CK of the unit shift register SR (this case corresponds to, e.g., the unit shift registers $SR_1$ and $SR_3$ shown in FIG. 2).

Herein, a gate line driving signal outputted from the unit shift register SR is defined as $G_n$, and the gate line driving signals outputted from the preceding-stage unit shift register SR and the succeeding-stage unit shift register SR are defined as $G_{n-1}$ and $G_{n+1}$ respectively. Further, a carry signal outputted from the unit shift register SR is defined as $D_n$, and the carry signals outputted from the preceding-stage unit shift register SR and the succeeding-stage unit shift register SR are defined as $D_{n-1}$ and $D_{n+1}$, respectively.

In an initial state, it is assumed that the nodes N1 and N3 are at the L (Low) level (VSS), and the node N2 is at the H (High) level (VDD2-Vth (Vth: threshold voltage of a transistor)). Further, it is assumed that the clock terminal CK (the clock signal CLK), the reset terminal RST (the carry signal $D_{n+1}$ of the succeeding stage) and the input terminal IN (the carry signal $D_{n-1}$ of the preceding stage) are all at the L level. In a reset state, since the transistor Q1 is off (in a cut-off state) and the transistor Q2 is on (in a conducting state), the gate line output terminal OUT (the gate line driving signal $G_n$) is kept at the L level regardless of the level of the clock terminal CK (the clock signal CLK). In other words, the gate line to which this unit shift register SR is connected is in the non-selected state. Further at that time, since the transistor Q1D is off and the transistor Q2D is on, the carry signal output terminal OUTD (the carry signal $D_n$) is kept at the L level.

Starting from that state, when the carry signal $D_{n-1}$ of the preceding-stage unit shift register SR rises to the H level, the signal is inputted to the input terminal IN of the current unit shift register SR to turn on the transistors Q3 and Q3D. At that time, since the node N2 is at the H level, the transistors Q4 and Q4D are on, but since the transistors Q3 and Q3D are set to have a driving capability sufficiently higher than that of the transistors Q4 and Q4D and have an on-state resistance sufficiently lower than that of the transistors Q4 and Q4D, the levels of the node N1 and N3 rise.

When the level of the node N1 rises, the transistor Q7 thereby starts conducting, to cause the node N2 to fall in level. Then, the resistances of the transistors Q4 and Q4D increase, to cause the levels of the nodes N1 and N3 to quickly rise. The transistor Q7 is accordingly turned on sufficiently. As a result, the node N2 falls to the L level (VSS), and the transistors Q4 and Q4D are turned off, to raise the nodes N1 and N3 to the H level (VDD1-Vth). Thus, in such a state where the nodes N1 and N3 are at the H level and the node N2 is at the L level (hereinafter, this state is referred to as a "set state"), the transistor Q1 is on and the transistor Q2 is off. Further, since the nodes N1 and N3 are brought into a floating state even when the carry signal $D_{n-1}$ of the preceding stage returns to the L level to turn off the transistors Q3 and Q3D, this set state is maintained after that.

In the set state, since the transistors Q1 and Q1D are on and the transistors Q2 and Q2D are off, when the clock signal CLK of the clock terminal CK rises to the H level, the levels of the gate line output terminal OUT and the carry signal output terminal OUTD rise. When the level of the gate line output terminal OUT rises, the level of the node N1 is stepped up by a certain voltage (for this reason, the node N1 is sometimes referred to as a "step-up node") by a capacitive coupling of the step-up capacitor C and the gate-channel capacitance (gate capacitance) of the transistor Q1. Similarly, when the level of the carry signal output terminal OUTD rises, the level of the node N3 is stepped up by a certain voltage by a capacitive coupling of the step-up capacitor CD and the gate-channel capacitance of the transistor Q1D.

For this reason, the gate-source voltages of the transistors Q1 and Q1D are maintained higher than the threshold voltage (Vth) even when the levels of the gate line output terminal OUT and the carry signal output terminal OUTD rise, and the transistors Q1 and Q1D accordingly maintain a low impedance. Therefore, the levels of the gate line driving signal $G_n$ and the carry signal $D_n$ vary along with the level of the clock terminal CK. Specifically, while the clock signal CLK inputted to the clock terminal CK is at the H level, the gate line driving signal $G_n$ rises to the H level to activate the gate line and the carry signal $D_n$ rises to the H level and is inputted to the succeeding-stage unit shift register SR. When the clock signal CLK returns to the L level, the gate line driving signal $G_n$ falls to the L level to bring the gate line into the non-selected state and at the same time, the carry signal $D_n$ falls to the L level.

After that, when the gate line driving signal $G_{n+1}$ of the succeeding stage rises to the H level, the signal is inputted to the reset terminal RST to turn on the transistor Q5. Since the level of the node N1 thereby falls and the transistor Q7 is turned off, the node N2 rises to the H level. Then, the transistors Q4 and Q4D are turned on and the nodes N1 and N3 are fixed to the L level. As a result, the circuit returns to the reset state where the transistor Q1 is off and the transistor Q2 is on (for this reason, the node N2 is referred to as a "reset node").

Giving a summary of the above-discussed operation, the unit shift register SR of the first preferred embodiment is in the reset state where the node N1 is at the L level (VSS) and the node N2 is at the H level (VDD2-Vth) unless a signal (the start pulse SP or the carry signal $D_{n-1}$ of the preceding stage) is inputted to the input terminal IN, and in this state, since the transistors Q1 and Q1D are off and the transistors Q2 and Q2D are on, the gate line output terminal OUT and the carry signal output terminal OUTD are maintained at the L level (VSS) with the low impedance. When the signal is inputted to the input terminal IN, the unit shift register SR comes into the set state where the node N2 is at the L level (VSS) and the nodes N1 and N3 are at the H level (VDD1-Vth). In the set state, since the transistors Q1 and Q1D are on and the transistors Q2 and Q2D are off, the gate line output terminal OUT rises to the H level to activate the gate line and the carry signal output terminal OUTD rises to the H level to drive the succeeding-stage unit shift register SR while the signal (clock signal CLK) of the clock terminal CK is at the H level. After that, when a signal (the gate line driving signal $G_{n+1}$ of the succeeding stage) is inputted to the reset terminal RST, the unit shift register SR returns to the reset state where the nodes N1 and N3 are at the L level and the node N2 is at the H level.

Figure 5:
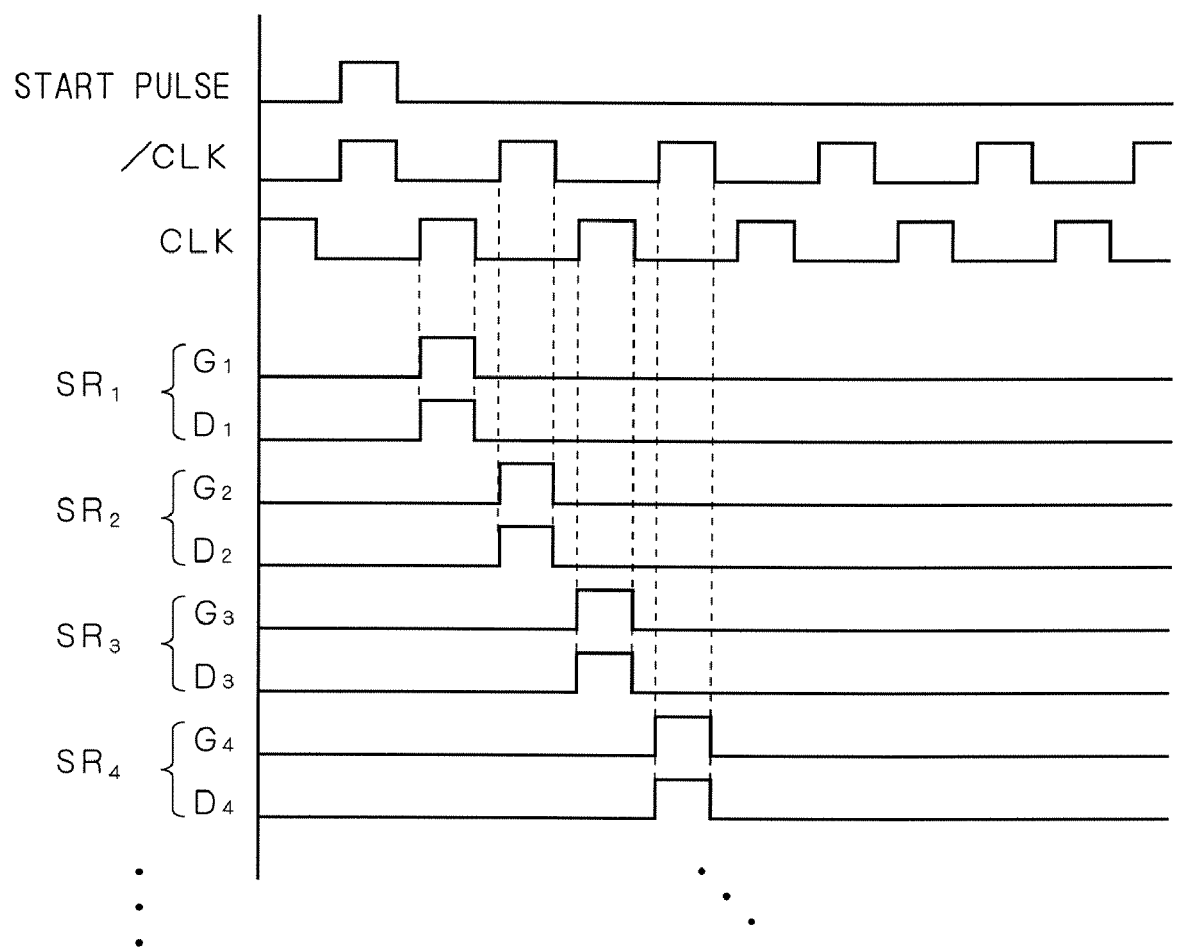
FIG. 5 is a timing chart showing an operation of the gate line driving circuit in accordance with the first preferred embodiment.

An operation of the gate line driving circuit 30 which consists of a plurality of unit shift registers SR connected in cascade, each of which operates as discussed above, is shown in the timing chart of FIG. 5. As shown in FIG. 5, the input signal (the start pulse) is inputted to the input terminal IN of the unit shift register $SR_1$ in the first stage is shifted at the timing in synchronization with the clock signals CLK and /CLK to become the gate line driving signals $G_1, G_2, G_3, \ldots$ to be sequentially outputted to the gate lines $GL_1, GL_2, GL_3, \ldots$, respectively, and become the carry signals $D_1, D_2, \ldots$, to be sequentially transmitted to the unit shift registers $SR_2, SR_3, \ldots$, respectively. The gate line driving circuit 30 can thereby sequentially drive the gate lines $GL_1, GL_2, GL_3, \ldots$ in a predetermined scanning cycle.

In the gate line driving circuit 30 having the constitution of FIG. 2, to the reset terminal RST of each unit shift register SR, the gate line driving signal $G_{n+1}$ of its succeeding stage is inputted, and therefore the current unit shift register SR returns to the reset state (i.e., the above initial state) only after its succeeding-stage unit shift register SR operates at least once. Since each unit shift register SR can not perform such a normal operation as shown in FIG. 3 unless it undergoes the reset state, it is necessary to perform a dummy operation for transmitting a dummy input signal from the first-stage unit shift register SR to the last-stage one prior to the normal operation. Alternatively, there may be a case where a rest transistor is provided additionally between the node N2 and the third power supply terminal s3 (high-potential power supply) in each unit shift register SR, to perform a reset operation for forcefully charging the node N2 prior to the normal operation. In this case, however, a signal line for resetting is additionally needed.

As can be seen from the above discussion, in the unit shift register SR of FIG. 3, the level of the gate of the transistor Q1 (the node N1) for activating the gate line driving signal and that of the gate of the transistor Q1D (the node N3) for activating the carry signal change almost similarly. Moreover, the same clock signal CLK is inputted to the drain of the transistor Q1 and that of the transistor Q1D. Therefore, as shown in FIG. 5, the gate line driving signal $G_n$ and the carry signal $D_n$ are outputted from the each unit shift register SR at almost the same timing.

In the first preferred embodiment, however, though the level of the node N1 and that of the node N2 change almost similarly, these nodes are not connected direct to each other and charged/discharged by different transistors (in other words, the nodes N1 and N3 are separated in circuitry). Further, while the node N1 is stepped up at the rise of the gate line driving signal $G_n$, the node N3 is stepped up at the rise of the carry signal $D_n$. Therefore, even if a load on the gate line, i.e., the gate line output terminal OUT is heavy to thereby cause a delay in the gate line driving signal $G_n$ and a delay is accordingly caused in step-up timing of the node N1, this exerts no influence upon step-up timing of the node N3. In other words, this prevents the influence of the gate line driving signal $G_n$ from being exerted upon the carry signal $D_n$, to allow an increase in rising/falling speed of the carry signal $D_n$, regardless of the gate line driving signal $G_n$ whose rising/falling speed is hard to increase due to the influence of the load. Further, even if there arises a decrease in rising/falling speed of the gate line driving signal $G_n$ due to variations in ambient temperature, threshold voltage of a transistor or the like, no ill influence is exerted upon the carry signal $D_n$. Therefore, it is possible to achieve a higher-speed operation of the shift register circuit consisting of the unit shift registers SR which are connected in cascade, and this contributes to higher resolution of a display apparatus using the gate line driving circuit formed of the shift register circuit.

The first preferred embodiment shows the constitution in which to the reset terminal RST of each unit shift register SR, the gate line driving signal $G_{n+1}$ of its succeeding stage is inputted. Though a delay may be caused in the gate line driving signal $G_{n+1}$ of the succeeding stage by an influence of the load of the succeeding-stage gate line, there is no ill influence upon the speedup of the operation of the unit shift register SR since the speed at which the unit shift register SR is brought into the reset state may be relatively slow. Further, instead of this, there may be a constitution in which to the reset terminal RST of each unit shift register SR, the carry signal $D_{n+1}$ of its succeeding stage is inputted. In such a case, however, since the load on the carry signal output terminal OUTD of each unit shift register SR increases, it should be noted that a delay caused in the carry signal may reduce the effect of the present invention. Further, since the signal to be inputted to the reset terminal RST may be the gate line driving signal $G_{n+1}$ or the carry signal $D_{n+1}$ of the succeeding stage, the flexibility in layout design for a circuit increases and this contributes to reduction in area for forming the circuit.

In the unit shift register SR of the first preferred embodiment, the inverter constituted of the transistors Q6 and Q7 uses the node N1 as an input end and the node N2 as an output end. The node N3 may be used as the input end of the inverter since this causes no change in logical operation of the unit shift register SR because of symmetry of the circuit. In such a case, however, since the gate capacitance of the transistor Q7 contributes to the parasitic capacitance of the node N3, the parasitic capacitance increases and this causes reduction in amplitude at which the node N3 is stepped up. If the node N3 is not sufficiently stepped up, the driving capability of the transistor Q1D decreases and the rising/falling speed of the carry signal $D_n$ decreases, to thereby reduce the effect of the present invention. Therefore, it is preferable that the input end of the inverter constituted of the transistors Q6 and Q7 should be the node N1.

The Second Preferred Embodiment

A field effect transistor including a TFT is an element which becomes conducting through an electrical connection between its drain and source with a conductive channel formed immediately below a gate electrode with a gate insulation film interposed therebetween when a voltage not less than a threshold voltage is applied to its gate. Therefore, the field effect transistor in the conducting state may also function as a capacitive element (gate capacitance) with its gate and channel serving as both electrodes and the gate insulation film serving as a dielectric layer.

FIG. 6 is a circuit diagram showing a configuration of a unit shift register SR in accordance with the second preferred embodiment. Though the step-up capacitor CD is provided between the drain and the source of the transistor Q1D in the first preferred embodiment, it is replaced by the gate capacitance of the transistor Q1D in the second preferred embodiment. In such a case, the step-up capacitor CD is not needed, as shown in the circuit diagram of FIG. 6.

Since an insulating film to become a dielectric layer of a capacitive element formed in a semiconductor integrated circuit generally has the same thickness as a gate insulating film of a transistor, if a capacitive element is replaced by a gate capacitance of the transistor, a transistor having the same area as the capacitive element may be used instead. Specifically, by increasing the gate width of the transistor Q1D as necessary in FIG. 6, it is possible to achieve a step-up operation equivalent to that performed by the circuit shown in FIG. 3 in accordance with the first preferred embodiment.

Further, by increasing the gate width of the transistor Q1D, it is possible to increase its driving capability, and as a result, the rising/falling speed of the carry signal $D_n$ increases, to thereby improve the effect of the present invention to ensure a speedup of the operation.

Though not shown in the figure, the step-up capacitor C between the drain and the source of the transistor Q1 can be also replaced by the gate capacitance of the transistor Q1. Specifically, the step-up capacitor C is omitted and the gate width of the transistor Q1 has only to be increased as necessary. In such a case, since the driving capability of the transistor Q1 increases, it is consequently possible to increase the rising/falling speed of the gate line driving signal $G_n$.

Further, in the second preferred embodiment, the high power supply potentials VDD1 and VDD2 may be at the same level. In such a case, like in the above-discussed circuit of FIG. 4, the second power supply terminal s2 and the third power supply terminal s3 may be formed of the same terminal, and this can reduce the area occupied by the wires for power supply.

The Third Preferred Embodiment

The background-art unit shift register shown in Patent Documents 2 to 5 has a constitution in which a gate electrode of a transistor for pull-up of an output terminal (e.g., "the output transistor 16" in Patent Document 1; hereinafter, referred to as an "output pull-up transistor") is charged through a diode-connected transistor (hereinafter, referred to as a "charge transistor"). Specifically, in the charge transistor, its source is connected to the gate electrode of the output pull-up transistor and an output signal of the preceding-stage unit shift register is inputted to both its gate and drain. Therefore, the gate electrode of the output pull-up transistor is charged with the output signal of the preceding stage as a power supply. Since this accordingly eliminates the necessity of connecting the unit shift register to a power supply (the high-potential power supply (VDD1) in the above preferred embodiments) for charging the gate electrode of the output pull-up transistor, the flexibility in wiring layout increases and this advantageously contributes to higher integration of the circuit.

In a case, however, where a shift register is used for a gate line driving circuit of a display apparatus, since a gate line having a heavy capacity load is connected to an output terminal of a unit shift register, an output signal rises slowly. Then, in the above constitution, the charging speed of the gate electrode of the output pull-up transistor in each unit shift register decreases. As a result, the speedup of the operation of each unit shift register becomes difficult and the speedup of the operation of the gate line driving circuit accordingly becomes difficult.

The diode-connected charge transistor operates in a source follower mode when the gate electrode of the output pull-up transistor is charged. In other words, as the charge proceeds, the gate-source voltage of the charge transistor becomes lower and its driving capability decreases, to make the charging speed lower. If the rising speed of an output signal of each unit shift register becomes lower due to an influence of the heavy capacity load of the gate line or the like, in particular, since the charge transistor operates in the source follower mode from an initial stage of charging, the charging speed significantly decreases. This is also a factor to prevent the speedup of the operation of the gate line driving circuit.

In order to ensure the speedup of the operation of the unit shift register, the driving capability (the capability of carrying current) of the output pull-up transistor in outputting a signal has only to be raised. As a method therefor, the channel width of the output pull-up transistor may be increased, but this is not preferable because the area for forming a circuit disadvantageously increases.

Another method for increasing the driving capability of the output pull-up transistor is to keep the gate-source voltage of the output pull-up transistor high even in outputting a signal. In the unit shift register SR of the first preferred embodiment, for example, it is necessary to make the gate potential of the transistor Q1 sufficiently high prior to the step-up of the gate of the transistor Q1 (the node N1).

The third preferred embodiment suggests a unit shift register in the shift register of the present invention, which allows the power supply (the high-potential power supply (VDD1) in the above preferred embodiments) for charging the gate electrode of the output pull-up transistor to be omitted and achieves a higher-speed operation.

Figure 7:
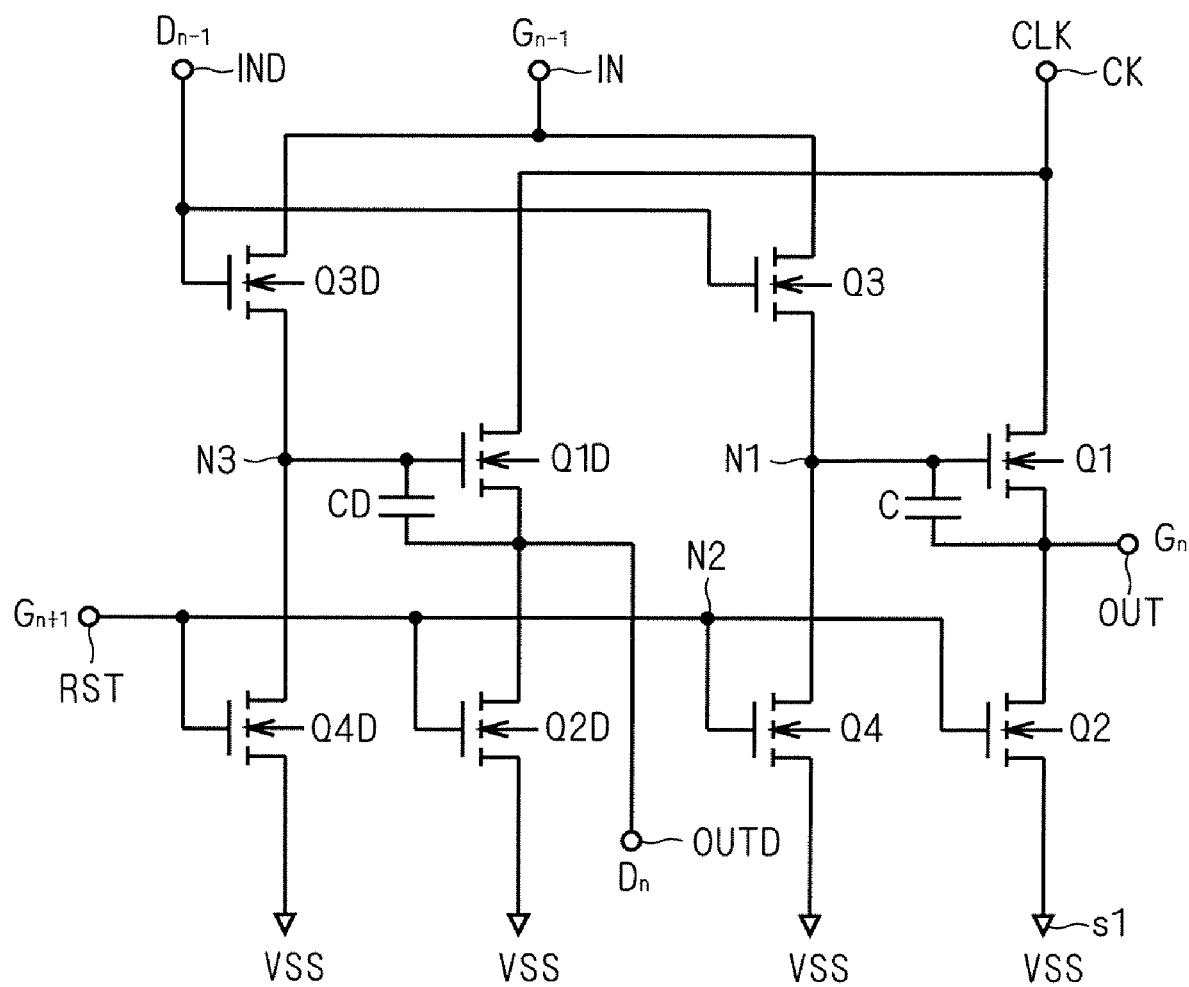
FIG. 7 is a circuit diagram showing a configuration of a unit shift register in accordance with a third preferred embodiment.

FIG. 7 is a circuit diagram showing a configuration of a unit shift register SR in accordance with the third preferred embodiment of the present invention. In FIG. 7, elements having the same functions as those of FIG. 3 are represented by the same reference signs and detailed description thereof will be therefore omitted.

As shown in FIG. 7, the unit shift register SR of the third preferred embodiment has two output terminals OUT and OUTD and two input terminals IN and IND. To the first input terminal IN, the drains of the transistors Q3 and Q3D are connected and to the second input terminal IND, the gates of the transistors Q3 and Q3D are connected. Specifically, in the third preferred embodiment, the transistor Q3 is connected between the first input terminal IN and the node N1 and the transistor Q3D is connected between the first input terminal IN and the node N3. In other words, the high-potential power supply (VDD1 in FIG. 3) is not connected to the drains of the transistors Q3 and Q3D.

In the third preferred embodiment, the gates of the transistors Q2 and Q2D (the node N2) and the gates of the transistors Q4 and Q4D are connected to the reset terminal RST. This allows a constitution in which the inverter constituted of the transistors Q6 and Q7 and its power supply (VDD2 in FIG. 3) are omitted.

Figure 8:
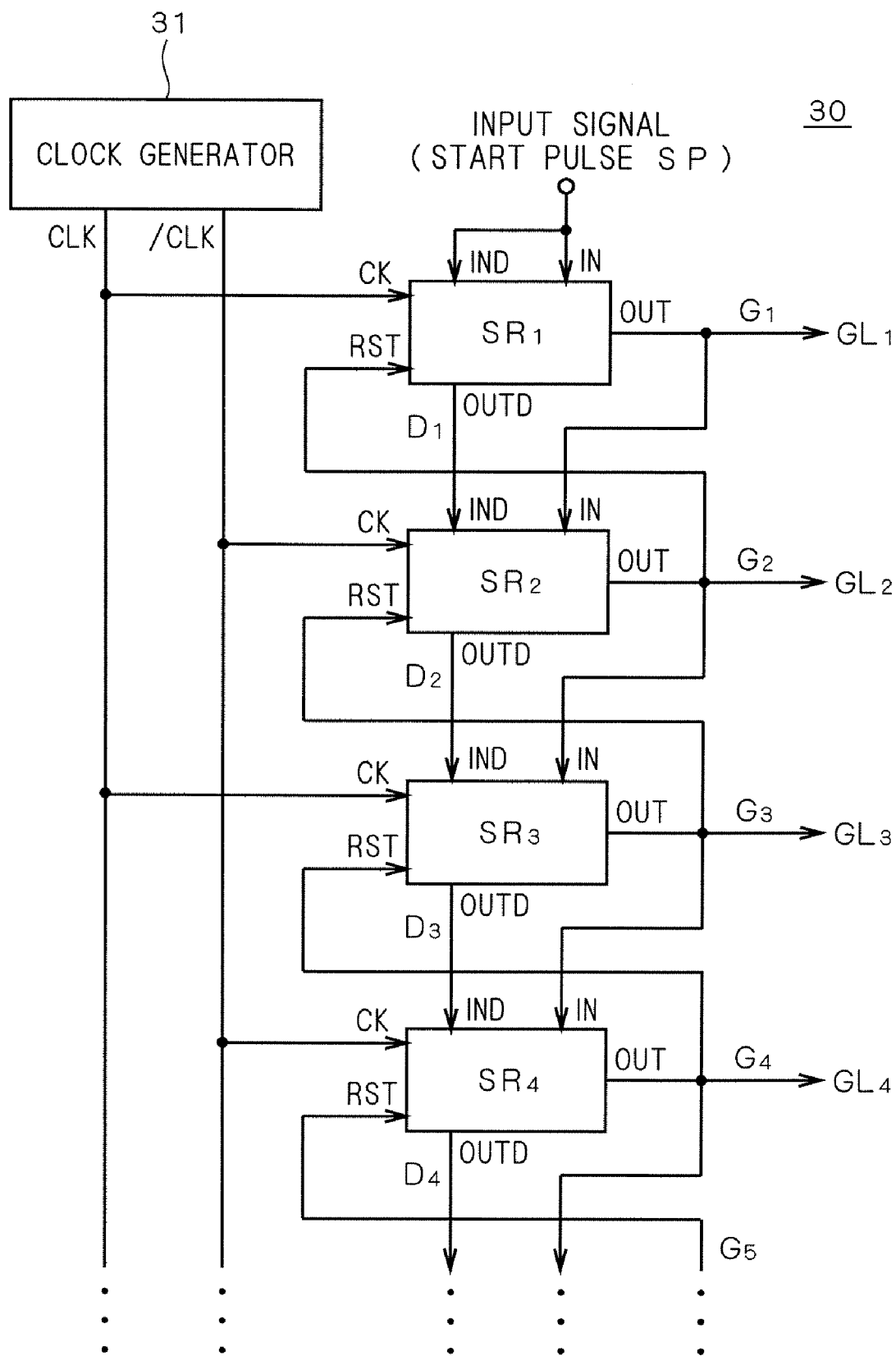
FIG. 8 is a block diagram showing a constitution of a gate line driving circuit in accordance with the third preferred embodiment.

FIG. 8 is a block diagram showing a constitution of a gate line driving circuit using the unit shift registers SR in accordance with the third preferred embodiment. Also in the third preferred embodiment, the gate line driving circuit 30 is formed of a shift register consisting of a plurality of unit shift registers $SR_1$, $SR_2$, $SR_3$, $SR_4$, . . . which are connected in cascade, and to the clock terminal CK of each unit shift register SR, either of the clock signals CLK and /CLK outputted from the clock generator 31 is provided.

The unit shift register SR of the third preferred embodiment has two input terminals IN and IND, and the start pulse SP is inputted to both the input terminals IN and IND of the unit shift register $SR_1$ in the first stage. In the unit shift registers SR of the second and following stages, the first input terminal IN is connected to the gate line output terminal OUT of its preceding stage and the second input terminal IND is connected to the carry signal output terminal OUTD of its preceding stage.

Further, the unit shift register SR of the third preferred embodiment has two output terminals OUT and OUTD, and the gate line GL in the display panel is connected to the gate line output terminal OUT among these two output terminals. Specifically, an output signal from the gate line output terminal OUT serves as a horizontal (or vertical) scanning pulse for activating the gate line GL. The gate line output terminal OUT is further connected to the reset terminal RST of its preceding stage and the first input terminal IN of its succeeding stage. On the other hand, the carry signal output terminal OUTD is connected only to the second input terminal IND of its succeeding stage.

Also in the gate line driving circuit 30 having such a constitution, each unit shift register SR shifts a signal inputted from the preceding stage (the gate line driving signal G and the carry signal D of its preceding stage) with time in synchronization with the clock signals CLK and /CLk and transmits the shifted signal to the corresponding gate line GL and the unit shift register SR of its succeeding stage. Hereinafter, an operation of each of the unit shift registers SR constituting the gate line driving circuit 30 will be discussed.

Figure 9:
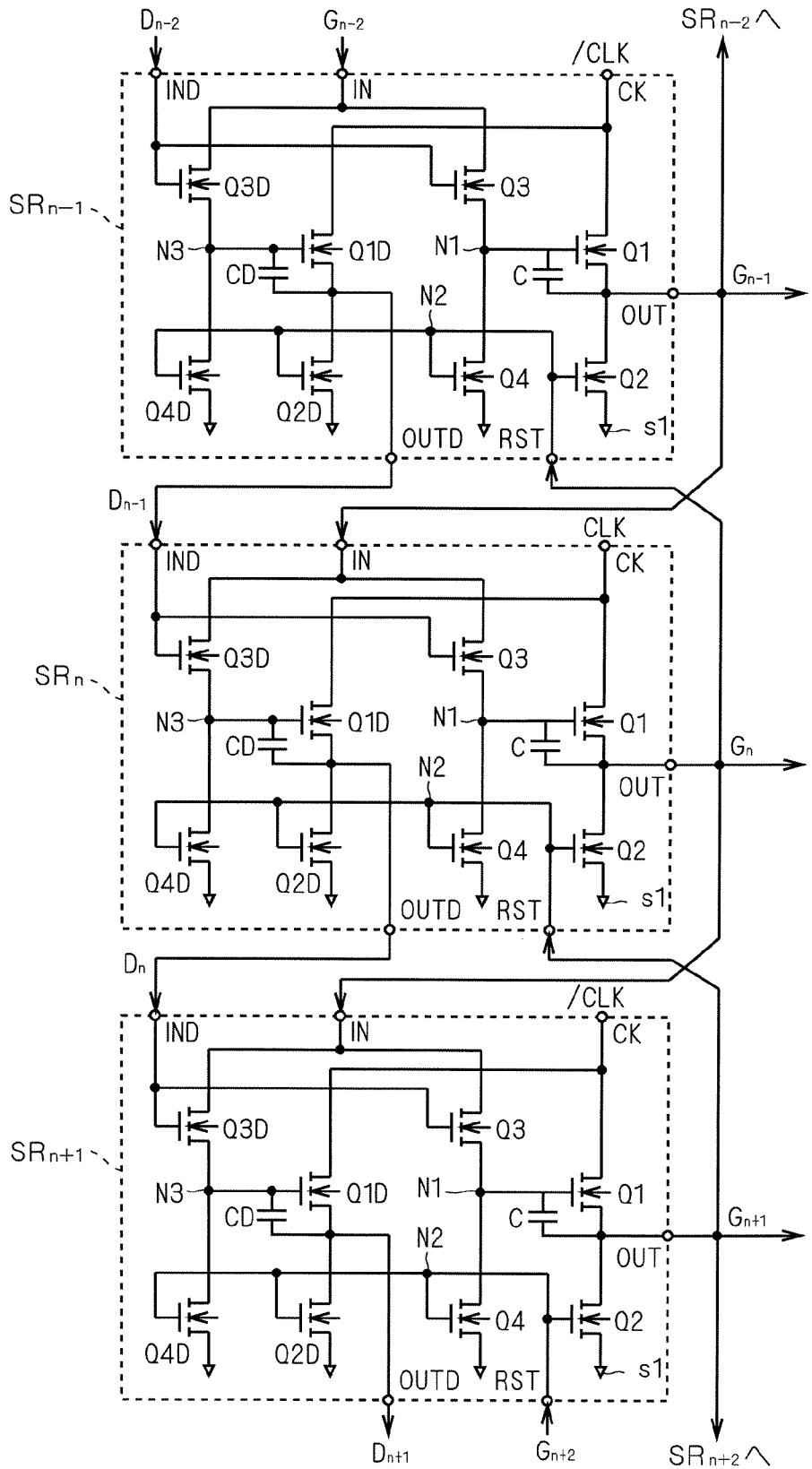
FIG. 9 is a circuit diagram showing a configuration of the gate line driving circuit in accordance with the third preferred embodiment.
Figure 10:
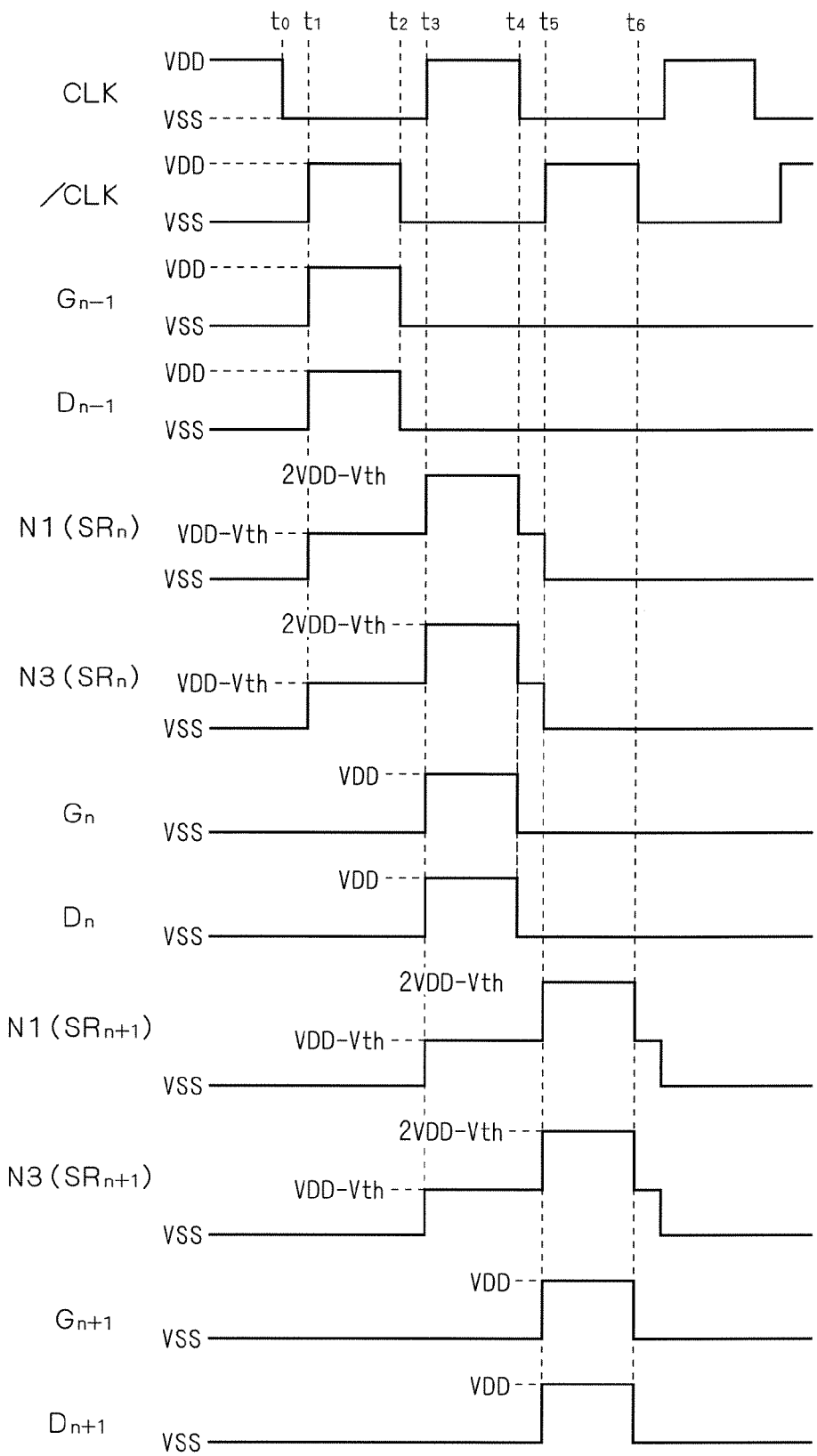
FIG. 10 is a timing chart showing an operation of the unit shift register in accordance with the third preferred embodiment.

Also herein, an operation of the unit shift register $SR_n$ of the n-th stage will be discussed as a representative example. FIG. 9 is a circuit diagram showing the connection of the unit shift register $SR_n$ of the n-th stage, the unit shift register $SR_{n-1}$ of its preceding stage (the (n−1)th stage) and the unit shift register $SR_{n+1}$ of its succeeding stage (the (n+1)th stage). FIG. 10 is a timing chart showing an operation of the unit shift register $SR_n$. Hereinafter, referring to FIGS. 9 and 10, an operation of the unit shift register SR of the third preferred embodiment shown in FIG. 7 will be discussed.

For simple discussion, it is assumed that the clock signal CLK is inputted to the clock terminal CK of the unit shift register $SR_n$ and the clock signal /CLK is inputted to the clock terminals CK of the unit shift registers $SR_{n-1}$ and $SR_{n+1}$. The gate line driving signal G from the gate line output terminal OUT of the unit shift register $SR_i$ of the i-th stage is represented by reference sign $G_i$ and the carry signal D from the carry signal output terminal OUTD is represented by reference sign $D_i$. Further, it is assumed that the levels of the clock signals CLK and /CLK at the H level are equivalent to each other and its value is VDD. Furthermore, it is assumed that values of threshold voltages of the transistors constituting the unit shift register SR are all equal to one another and the value is Vth.

Referring to FIG. 10, in the initial state at time to, first, the unit shift register $SR_n$ is in the reset state where the nodes N1 and N3 are at the L level (VSS). In this state, the gate line driving signal $G_{n-1}$ and the carry signal $D_{n-1}$ of the unit shift register $SR_{n-1}$ and the gate line driving signal $G_{n+1}$ and the carry signal $D_{n+1}$ of the unit shift register $SR_{n+1}$ are at the L level. In this case, since the transistors Q1, Q2, Q1D and Q2D in the unit shift register $SR_n$ are all off, the gate line output terminal OUT and the carry signal output terminal OUTD are in the floating state and in this initial state, the gate line driving signal $G_n$ and the carry signal $D_n$ are at the L level.

It is assumed that at time $t_1$ where the clock signal /CLK rises to the H level, the gate line driving signal $G_{n-1}$ and the carry signal $D_{n-1}$ of the preceding stage rise to the H level. Then, the unit shift register $SR_n$ comes into the set state where the transistors Q3 and Q3D thereof are turned on and the nodes N1 and N3 rise to the H level (VDD-Vth). The transistors Q1 and Q1D are accordingly turned on. Since the clock signal CLK is at the L level (VSS) at that time, however, the output signal $G_n$ is kept at the L level.

When the clock signal /CLK falls at time $t_2$, the gate line driving signal $G_{n-1}$ and the carry signal $D_{n-1}$ of the preceding stage fall to the L level, but since the transistors Q3 and Q3D are turned off and the transistors Q4 and Q4D are kept off, the nodes N1 and N3 are kept at the H level (VDD-Vth) in the floating state.

When the clock signal CLK rises at time t3, since the transistors Q1 and Q1D are on and the transistors Q2 and Q2D are off at that time, the levels of the gate line output terminal OUT and the carry signal output terminal OUTD begin to rise. At that time, the nodes N1 and N3 are stepped up by the coupling through the gate-channel capacitances of the transistors Q1 and Q1D and the step-up capacitors C and CD. Therefore, the transistors Q1 and Q1D operate in a non-saturated area and the levels of the gate line driving signal $G_n$ and the carry signal $D_n$ rise to the H level, not accompanying the voltage loss by threshold voltage Vth of the transistors Q1 and Q1D. As a result, the levels of the nodes N1 and N3 rise to almost 2×VDD-Vth.

When the gate line driving signal $G_n$ and the carry signal $D_n$ of the unit shift register $SR_n$ rise to the H level, since these signals are inputted to the first and second input terminals IN and IND of the unit shift register $SR_{n+1}$ of its succeeding stage, the transistors Q3 and Q3D in the unit shift register $SR_{n+1}$ are turned on. Therefore, at time $t_3$, the nodes N1 and N3 in the unit shift register $SR_{n+1}$ are charged to VDD-Vth.

When the clock signal CLK falls at time $t_4$, the levels of the gate line driving signal G and the carry signal D of the unit shift register $SR_n$ also fall. At that time, the levels of the nodes N1 and N3 fall to VDD-Vth by the coupling through the gate-channel capacitances of the transistors Q1 and Q1D and the step-up capacitor C. Even in this case, however, since the transistors Q1 and Q1D are kept on, the gate line driving signal $G_n$ and the carry signal $D_n$ fall to the L level, i.e., VSS following the clock signal CLK.

When the clock signal /CLK rises at time $t_5$, the nodes N1 and N3 in the unit shift register $SR_{n+1}$ of the succeeding stage are stepped up and the gate line driving signal $G_{n+1}$ and the carry signal $D_{n+1}$ rise to the H level (VDD). The reset terminal RST in the unit shift register $SR_n$ thereby rises to the H level. Since the transistors Q4 and Q4D are accordingly turned on, the nodes N1 and N3 are discharged to the L level and the transistors Q1 and Q1D are turned off. In other words, the unit shift register $SR_n$ returns to the reset state. Further in the third preferred embodiment, since the reset terminal RST is also connected to the gates of the transistors Q2 and Q2D (the node N2), the transistors Q2 and Q2D are turned on and the gate line driving signal $G_n$ and the carry signal $D_n$ are surely brought into VSS.

When the clock signal /CLK falls to the L level at time $t_6$, since the gate line driving signal $G_{n+1}$ and the carry signal $D_{n+1}$ of the succeeding stage fall to the L level, the reset terminal RST in the unit shift register $SR_n$ is accordingly brought into the L level. As a result, the transistors Q2, Q2D, Q4 and Q4D are turned off and the unit shift register $SR_n$ returns to the above initial state (the state at time $t_0$).

Giving a summary of the above-discussed operation, the unit shift register $SR_n$ of the third preferred embodiment is in the reset state where the nodes N1 and N3 are at the L level unless a signal (the gate line driving signal $G_{n-1}$ and the carry signal $D_{n-1}$ of the preceding stage or the start pulse SP) is inputted to the first and second input terminals IN and IND. In the reset state, since the transistors Q1 and Q1D are off, the gate line driving signal $G_n$ and the carry signal $D_n$ are maintained at the L level, regardless of the level of the clock signal CLK. When the signal is inputted to the first and second input terminals IN and IND, the unit shift register $SR_n$ comes into the set state where the nodes N1 and N3 are at the H level. In the set state, since the transistors Q1 and Q1D are on and the transistors Q2 and Q2D are off, the gate line driving signal $G_n$ and the carry signal $D_n$ are outputted in accordance with the rise of the clock signal CLK to the H level. After that, when a signal (the gate line driving signal $G_{n+1}$ of the succeeding stage) is inputted to the reset terminal RST, the unit shift register $SR_n$ returns to the reset state where the nodes N1 and N3 are at the L level, and the gate line driving signal $G_n$ and the carry signal $D_n$ are maintained at the L level.

In the multistage shift register (gate line driving circuit 30) in which a plurality of unit shift registers SR each operating as above are connected in cascade as shown in FIGS. 8 and 9, when the start pulse SP is inputted to the unit shift register $SR_n$ of the first stage, with this as a trigger, the gate line driving signal G and the carry signal D are shifted at the timing in synchronization with the clock signals CLK and /CLK and transmitted to the unit shift registers $SR_2$, $SR_3$ . . . sequentially. The gate line driving circuit 30 can thereby sequentially drive the gate lines $GL_1$, $GL_2$, $GL_3$ . . . in a predetermined scanning cycle.

As can be seen from FIG. 7, in the unit shift register SR of the third preferred embodiment, the transistors Q1 and Q2 connected to the gate line output terminal OUT and the transistors Q1D and Q2D connected to the carry signal output terminal OUTD are connected in parallel to each other. The transistors Q3 and Q4 constituting the pull-up driving circuit (the first driving circuit) for driving the transistor Q1 and the transistors Q3D and Q4D constituting the pull-up driving circuit (the second driving circuit) for driving the transistor Q1D are connected in parallel to each other. Further, the gates of the transistors Q2 and Q2D are connected to each other. Therefore, logically, the transistors Q1 and Q1D are switched between on and off at the same timing and the transistors Q2 and Q2D are switched between on and off at the same timing.

For this reason, as shown in FIG. 10, logically, the levels of the gate line driving signal $G_n$ and the carry signal $D_n$ are similarly changed together. Therefore, the logical operation of the gate line driving circuit 30 is the same as that of the unit shift register of the first preferred embodiment (shown in FIG. 5). The unit shift register SR of the third preferred embodiment, however, produces the following effect.

FIG. 11 is a graph used for discussion on an effect of the present invention, showing a voltage waveform of the node N1 at the time when the nodes N1 and N3 are charged (precharged) and the time when these are stepped up. Times $t_1$ to $t_5$ in FIG. 11 correspond to those of FIG. 10. Since a voltage waveform of the node N3 is essentially the same as that of the node N1, discussion will be made herein mainly on the node N1.

In the gate line driving circuit 30 of the third preferred embodiment, the gate line output terminal OUT of each unit shift register SR is connected to the reset terminal RST of its preceding stage, the first input terminal IN of its succeeding stage and the gate line GL having a heavy capacity load. On the other hand, since the carry signal output terminal OUTD is connected only to the second input terminal IND of its succeeding stage, the value of load capacitance in the carry signal output terminal OUTD is significantly smaller than that in the gate line output terminal OUT. Therefore, the carry signal D of each unit shift register SR can rise more quickly than the gate line driving signal G.

Again in the unit shift register $SR_n$ of the n-th stage, when the clock signal /CLK rises at time $t_1$, the carry signal $D_{n-1}$ of its preceding stage rises more quickly than the gate line driving signal $G_{n-1}$ of the preceding stage, as shown in FIG. 11. Then, as shown in FIG. 9, the gate line driving signal $G_{n-1}$ is inputted to the drain of the transistor Q3 (the first input terminal IN) for charging the node N1 in the unit shift register $SR_n$ and the carry signal $D_{n-1}$ is inputted to the gate (the second input terminal IND). Therefore, when the levels of the gate line driving signal $G_{n-1}$ and the carry signal $D_{n-1}$ of the preceding stage rise, the transistor Q3 of the unit shift register $SR_n$ is turned on to charge the node N1, and the level of the node N1 rises as shown in FIG. 11.

Since the carry signal $D_{n-1}$ of the preceding stage rises more quickly than the gate line driving signal $G_{n-1}$ of the preceding stage at that time, the gate potential of the transistor Q3 is sufficiently larger than the drain potential in the initial period for the charge of the node N1. Therefore, the transistor Q3 operates in a non-saturated area and the level of the node N1 rises with almost the same level as the carry signal $G_{n-1}$.

After that, since the transistor Q3 begins to come into an operation in the non-saturated area and the rise in level of the node N1 is delayed with time constant based on the parasitic capacitance accompanying the node N1 as the level of the node N1 rises, the difference in level between the node N1 and the gate line driving signal $G_{n-1}$ of the preceding stage gradually becomes larger. Then, in the last period for the charge of the node N1, the transistor Q3 completely operates in the non-saturated area and the difference in level becomes much larger.

When the clock signal /CLK falls at time $t_2$, the level of the node N1 stops rising up to the level (V1 shown in FIG. 11) which is lower than the H level (VDD) of the gate line driving signal $G_{n-1}$ of the preceding stage to some degree. At time $t_2$, since there is a difference in the value of load capacitance between the gate line output terminal OUT and the carry signal output terminal OUTD in the unit shift register $SR_{n-1}$ of the preceding stage, the gate line driving signal $G_{n-1}$ falls in level less quickly than the carry signal $D_{n-1}$.

After than, when the clock signal CLK rises at time $t_3$, the level of the node N1 is stepped up by the capacitive coupling through the gate-channel capacitances of the transistors Q1 and Q1D and the step-up capacitor C. The stepped-up level of the node N1 is maintained until time $t_4$ when the clock signal CLK falls. Since the node N1 is maintained at the sufficiently high level from time $t_3$ to time $t_1$, the driving capabilities of the transistors Q1 and Q2D at the time when the unit shift register $SR_n$ outputs the gate line driving signal $G_n$ and the carry signal $D_n$ can be maintained high. It is thereby possible for the gate line driving signal $G_n$ and the carry signal $D_n$ to rise or fall at high speed.

On the other hand, the broken-line graph of FIG. 11 indicates the change in level of the node N1 in a constitution where the transistor Q3 is diode-connected, like in the background-art unit shift register. In the case where the transistor Q3 is diode-connected, since its drain and gate are connected to each other, the transistor Q3 always operates in the non-saturated area. Therefore, from the initial period for the charge of the node N1, the level of the node N1 is lower than that of the gate line driving signal $G_{n-1}$ of the preceding stage by the threshold voltage Vth of the transistor Q3. Further, since the transistor Q3 operates in the source follower mode from the initial period for the charge of the node N1, its charging speed is not high. For this reason, as indicated by the broken-line graph of FIG. 11, the level of the node N1 can rise only up to the level V2 lower than the above level V1 at time $t_3$.

Assuming that the potential difference between the levels V1 and V2 is ΔV, this voltage difference ΔV is maintained even when the node N1 is stepped up at time $t_4$. In other words, in the unit shift register SR of the third preferred embodiment, the level of the node N1 from time $t_3$ to time $t_4$ can be made higher by ΔV than that in the case where the transistor Q3 is diode-connected.

Though not discussed, based on the same theory as the above, the level of the node N3 is higher than that in the case where the transistor Q3 is diode-connected. As a result, the driving capabilities of the transistors Q1 and Q1D increase at the time when the gate line driving signal $G_n$ and the carry signal $D_n$ are outputted, and the gate line driving signal $G_n$ and the carry signal $D_n$ can rise and fall at high speed. Therefore, the shift register of the third preferred embodiment can operate at higher speed, as compared with that of the first preferred embodiment.

The above effect is produced by the fact that the carry signal $D_n$ inputted to the gate of the transistor Q3 (the second input terminal IND) quickly rises in each of the unit shift registers SR connected in cascade, and this effect becomes greater as the speed becomes higher. Therefore, it is preferable that the load capacitance on the carry signal output terminal OUTD should be smaller.

Like in the first preferred embodiment, though the level of the node N1 and that of the node N3 change almost similarly, these nodes are not connected direct to each other and charged/discharged by different transistors (in other words, the nodes N1 and N3 are separated in circuitry). This prevents the influence of the gate line driving signal $G_n$ from being exerted upon the carry signal $D_n$, to allow an increase in rising/falling speed of the carry signal $D_n$.

The gate line driving circuit of the third preferred embodiment has the constitution, as shown in FIGS. 8 and 9, in which the gate line driving signal G of each unit shift register SR is supplied to the reset terminal RST of its preceding stage, the first input terminal IN of its succeeding stage and the gate line GL and the carry signal D is supplied only to the second input terminal IND of its succeeding stage. Since the gate line driving signal G and the carry signal D have almost the same waveforms, as shown in FIG. 10, however, for example, the carry signal D may be supplied to the reset terminal RST of its preceding stage. Specifically, there may be a constitution of each unit shift register SR where the gate line output terminal OUT is connected to the first input terminal IN of its succeeding stage and the gate line GL and the carry signal output terminal OUTD is connected to the reset terminal RST of its preceding stage and the second input terminal IND of its succeeding stage.

In such a case, however, since the capacity load on the carry signal output terminal OUTD becomes larger by the gate capacitances of the transistors Q2, Q2D, Q4 and Q4D in the preceding-stage unit shift register SR, it should be noted that the rising speed of the carry signal D becomes lower than that in the cases of FIGS. 8 and 9 and the effect of the present invention slightly decreases.

Further, it is not impossible to operate each unit shift register SR, for example, with the carry signal D to be also supplied to the first input terminal IN of its succeeding stage. In such a case, however, the gate capacitances of the transistors Q1 and Q1D of its succeeding stage and the step-up capacitors C and CD are exerted upon the carry signal output terminal OUTD as a load through the transistors Q3 and Q3D of its succeeding stage, and the capacity load on the carry signal output terminal OUTD accordingly becomes larger by the above load. Particularly, since the channel width of the transistor Q1 used for charging the gate line GL is set large and the gate capacitance thereof is especially large, the rising speed of the carry signal D becomes lower and the effect of the present invention accordingly decreases. To prevent the decrease of the effect, the driving capability of the transistor Q1D has only to be raised so that the gate capacitance of the transistor Q1 of the succeeding stage can be charged quickly by the carry signal D. This is not preferable, however, because this raises the necessity of increasing the channel width of the transistor Q1D, resulting in an increase of the area for forming the circuit.

Though there is a certain interval between the period while the clock signal CLK is at the H level and the period while the clock signal /LKD is at the H level in the above discussion, this interval period may be eliminated. In other words, a two-phase clock in which the clock signal /CLK falls simultaneously with the rise of the clock signal CLK and the clock signal /CLK rises simultaneously with the fall of the clock signal CLK may be used.

Though the operation using the two-phase clock has been discussed in the above preferred embodiments, the unit shift register SR of the present invention can also be operated by using a three-phase clock, like the background-art shift register (see, e.g., FIG. 4 of Patent Document 1). In such a case, to the reset terminal RST of each unit shift register SR, the carry signal D of the stage after its succeeding stage may be inputted, and this can produce the same effect.

FIG. 12 is a circuit diagram showing a variation of the third preferred embodiment. In the case of FIG. 7, the drains of the transistors Q3 and Q3D are connected to the first input terminal IN and the gates thereof are connected to the second input terminal IND. In the third preferred embodiment, however, there may be a case, as shown in FIG. 12, where the transistor Q3D is diode-connected and the carry signal D of the preceding stage is inputted to both its gate and drain (the same applies to the following preferred embodiments).

In such a case, the gate capacitance of the transistor Q1D and the step-up capacitor CD are connected to the carry signal output terminal OUTD of each unit shift register SR through the transistor Q3D of its succeeding stage, and the load capacitance on the carry signal output terminal OUTD becomes larger by the above capacitances than that in the case of FIG. 7. As discussed above, this is not preferable because the load capacitance on the carry signal output terminal OUTD becomes larger and the rising speed of the carry signal D becomes lower, and the effect of the present invention accordingly decreases.

Since the carry signal output terminal OUTD is not connected to the gate line GL, however, the driving capability of the transistor Q1D may be relatively small and usually, the gate width is designed to be small in order to reduce the area for forming the circuit. Therefore, the gate capacitance of the transistor Q1D is relatively small and the increase in load capacitance on the carry signal output terminal OUTD is small even when the circuit shown in FIG. 12 is adopted, and accordingly, the rising speed of the carry signal D does not significantly decreases.

The Fourth Preferred Embodiment

Figure 13:
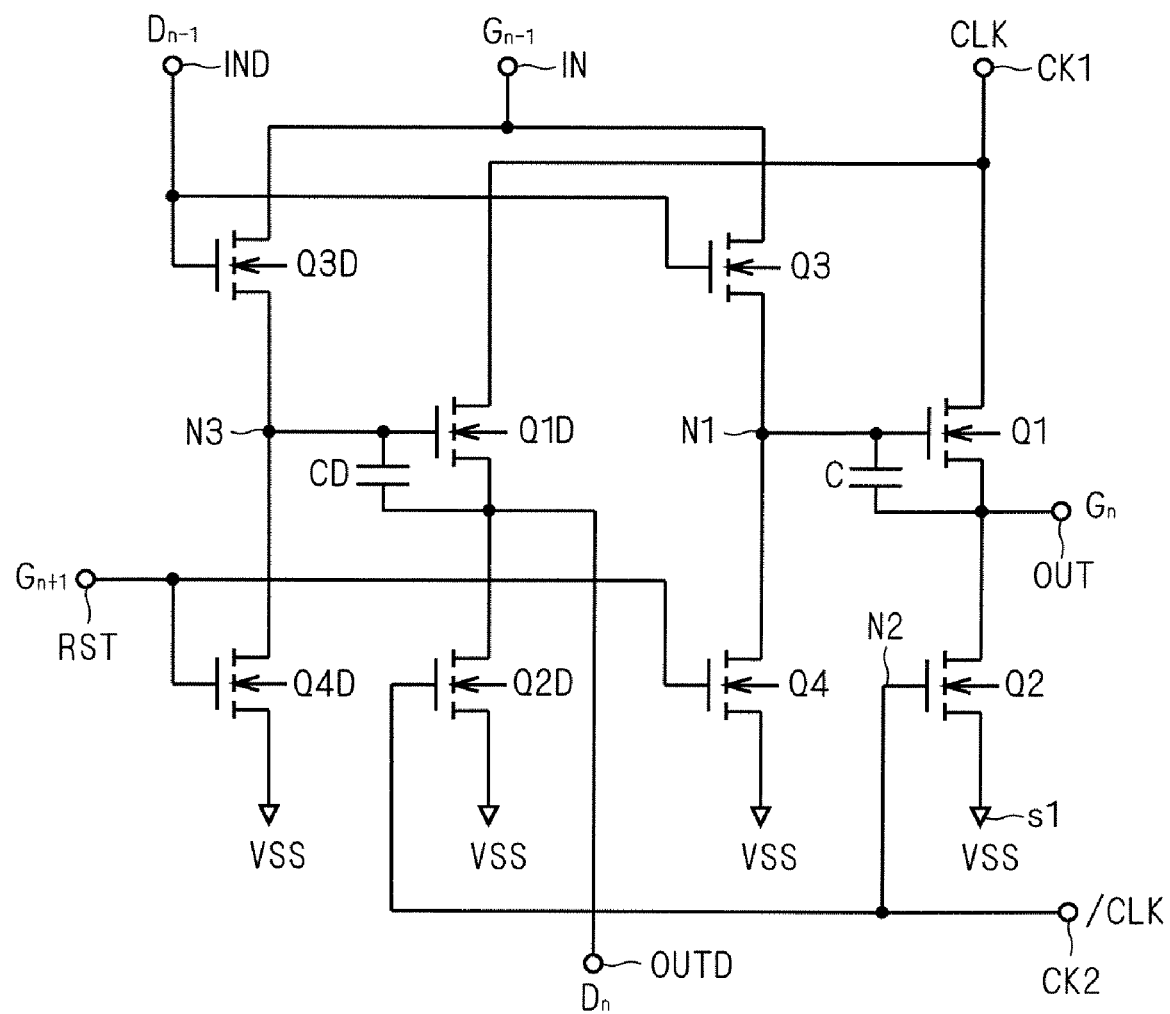
FIG. 13 is a circuit diagram showing a configuration of a unit shift register in accordance with a fourth preferred embodiment.

FIG. 13 is a circuit diagram showing a configuration of a unit shift register SR in accordance with the fourth preferred embodiment. In FIG. 13, elements having the same functions as those of FIG. 7 are represented by the same reference signs.

Though the unit shift register SR (FIG. 7) of the third preferred embodiment has one clock terminal CK, the unit shift register SR of the fourth preferred embodiment has two clock terminals CK1 and CK2 as shown in FIG. 13. Hereinafter, the clock terminal CK1 is referred to as "the first clock terminal" and the clock terminal CK2 is referred to as "the second clock terminal".

The first clock terminal CK1 corresponds to the clock terminal CK of the unit shift register SR of FIG. 7. Specifically, in the fourth preferred embodiment, a clock signal inputted to the first clock terminal CK1 is supplied to the gate line output terminal OUT and the carry signal output terminal OUTD through the transistors Q1 and Q1D, to thereby activate the gate line driving signal G and the carry signal D.

On the other hand, the second clock terminal CK2 is a terminal to which a clock signal having a phase different from that of the clock signal inputted to the first clock terminal CK1 is inputted. In a unit shift register SR where the clock signal CLK is inputted to the first clock terminal CK1, for example, the clock signal /CLK is inputted to the second clock terminal CK2. To the second clock terminal CK2, the gates of the transistors Q2 and Q2D (the node N2) are connected. Further, both the gates of the transistors Q4 and Q4D are connected to the reset terminal RST, like in the third preferred embodiment.

Also herein, the unit shift register $SR_n$ of the n-th stage will be discussed as a representative example. For simple discussion, it is assumed that the clock signal CLK is inputted to the first clock terminal CK1 and the clock signal /CLK is inputted to the second clock terminal CK2 in the unit shift register $SR_n$.

In the unit shift register $SR_n$ of the third preferred embodiment, the transistors Q2 and Q2D are turned on during the period while the gate line driving signal $G_{n+1}$ of the succeeding stage rises to the H level, to bring the gate line output terminal OUT and the carry signal output terminal OUTD into the L level with the low impedance only during the same period. In other words, during the other period, the gate line output terminal OUT and the carry signal output terminal OUTD are brought into the L level in the floating state.

On the other hand, in the unit shift register $SR_n$ of the fourth preferred embodiment, the transistors Q2 and Q2D are turned on every time when the clock signal /CLK inputted to the second clock terminal CK2 rises to the H level. Accordingly, the gate line output terminal OUT and the carry signal output terminal OUTD are brought into the L level with the low impedance repeatedly at short intervals. Therefore, the L-level potentials of the gate line driving signal $G_n$ and the carry signal $D_n$ become more stable. This consequently prevents a malfunction of the gate line driving circuit 30 and causes less display problem in the display apparatus because the level of the gate line GL in the non-selection period becomes stable.

The Fifth Preferred Embodiment

As a field effect transistor which is a constituent element of a gate line driving circuit in a display apparatus, an amorphous silicon thin film transistor (a-Si TFT) is widely used. It is known that a threshold voltage of the a-Si TFT largely shifts when the gate electrode is continuously biased. This phenomenon raises a problem of causing a malfunction of a gate line driving circuit. Not only the a-Si TFT but also an organic TFT causes the same problem.

In the unit shift register SR of the fourth preferred embodiment (FIG. 13), for example, the gates of the transistors Q2 and Q2D are repeatedly biased to the H level by the clock signal inputted to the second clock terminal CK2. For this reason, in the case where the unit shift register SR is formed of the a-Si TFT or the organic TFT, the threshold voltages of the transistors Q2 and Q2D are shifted in a normal (positive) direction. Then, the driving capabilities of the transistors Q2 and Q2D decrease and accordingly, the gate line output terminal OUT and the carry signal output terminal OUTD can not be brought into the L level sufficiently with the low impedance. As a result, the effect of the fourth preferred embodiment decreases and this causes more malfunction of the gate line driving circuit 30.

In order to suppress this problem, though the driving capabilities of the transistors Q2 and Q2D may be raised by increasing the channel widths thereof, this is not preferable because this causes an increase of the area for forming the circuit. The fifth preferred embodiment shows a variation of the fourth preferred embodiment, which can solve the above problem without any increase of the area for forming the circuit.

FIG. 14 is a circuit diagram showing a configuration of a unit shift register SR in accordance with the fifth preferred embodiment. In FIG. 14, elements having the same functions as those of FIG. 13 are represented by the same reference signs. In the unit shift register SR of FIG. 14, the sources of the transistors Q2 and Q2D are connected to the first clock terminal CK1. In other words, to the sources of the transistors Q2 and Q2D, a clock signal having a phase different from that of a signal inputted to the gates is inputted. Other than this, the circuit of FIG. 14 is equivalent to that of FIG. 13.

Also herein, the unit shift register $SR_n$ of the n-th stage will be discussed as a representative example. For simple discussion, it is assumed that the clock signal CLK is inputted to the first clock terminal CK1 and the clock signal /CLk is inputted to the second clock terminal CK2 in the unit shift register $SR_n$.

Since the clock signals CLK and /CLK are complementary to each other, while the clock signal /CLK is at the H level and the transistors Q2 and Q2D are on, the sources of these transistors are at the L level with the clock signal CLK. Therefore, like the case of the fourth preferred embodiment, the transistors Q2 and Q2D can bring the gate line output terminal OUT and the carry signal output terminal OUTD into the L level with the low impedance every time when the clock signal /CLK rises to the H level, and therefore, the effect of the fourth preferred embodiment can be produced.

Conversely, while the clock signal /CLK is at the L level and the transistors Q2 and Q2D are off, the sources of these transistors are at the H level with the clock signal CLK. In other words, this is equivalent to a state where the gates of the transistors Q2 and Q2D are biased in a negative direction with respect to the sources thereof. Since the threshold voltages which are shifted in the positive direction return to the negative direction and recover, this prevents the decrease in driving capability of the transistors Q2 and Q2D and solves the above problem. Further, it is obvious that no increase of the area for forming the circuit is caused.

Theoretically, the fifth preferred embodiment can also use the two-phase clock in which the clock signal /CLK falls simultaneously with the rise of the clock signal CLK and the clock signal /CLK rises simultaneously with the fall of the clock signal CLK. In practical use, however, due to variation in rise and fall of the clock signals CLK and /CLK, the source potential may rise before the transistors Q2 and Q2D of the unit shift register $SR_n$ are completely turned off. Then, an unnecessary rise in level of the gate line output terminal OUT and the carry signal output terminal OUTD may cause a malfunction. Therefore in the fifth preferred embodiment, as shown in FIG. 10, it is preferable that there should be a certain interval between the period while the clock signal CLK is at the H level and the period while the clock signal /LKD is at the H level.

The Sixth Preferred Embodiment

FIG. 15 is a circuit diagram showing a configuration of a unit shift register SR in accordance with the sixth preferred embodiment. In FIG. 15, elements having the same functions as those of FIGS. 3 and 7 are represented by the same reference signs.

In the sixth preferred embodiment, in addition to the unit shift register SR of the third preferred embodiment, the inverter constituted of the transistors Q6 and Q7 is provided like in the first preferred embodiment. As discussed in the first preferred embodiment, the transistor Q7 has an on-state resistance sufficiently lower than that of the transistor Q6, and the transistors Q6 and Q7 constitute a ratio inverter. The transistor Q6 is connected between the third power supply terminal s3 to which the high power supply potential VDD2 and the node N2 (the gates of the transistors Q2 and Q2D) and diode-connected. The transistor Q7 is connected between the node N2 and the first power supply terminal s1 and its gate is connected to the node N1 (the gates of the transistors Q1 and Q1D). Specifically, this inverter uses the node N1 as its input end and the node N2 as its output end. Further, the gates of the transistors Q4 and Q4D are connected to the reset terminal RST like in the third preferred embodiment.

Therefore, in the unit shift register SR of the sixth preferred embodiment, since the node N2 is maintained at the H level by the inverter constituted of the transistors Q6 and Q7 during a period while the node N1 is at the L level in the reset state, the transistors Q2 and Q2D are on during this period. In other words, while the unit shift register SR does not output the output signal G (during a non-selection period for the gate line GL), the gate line output terminal OUT and the carry signal output terminal OUTD are maintained at the L level with the low impedance. Therefore, the L-level potentials of the gate line driving signal $G_n$ and the carry signal $D_n$ become more stable and this prevents a malfunction of the gate line driving circuit 30.

Unlike in the fourth and fifth preferred embodiments, since it is not necessary to supply the clock signal to the gates of the transistors Q2 and Q2D, it is possible to reduce the alternating-current power consumed by the unit shift register SR. In other words, the sixth preferred embodiment has an advantage of reducing power consumption in a clock signal generating circuit (the clock generator 31 of FIG. 8). Since the transistors Q2 and Q2D are continuously at the H level, however, it should be noted that the shift of the threshold voltage is likely to be caused.

Further, the input end of the inverter constituted of the transistors Q6 and Q7 may be replaced by the node N3 since this causes no change in logical operation of the unit shift register SR because of symmetry of the circuit. In such a case, however, the gate capacitance of the transistor Q7 contributes to the parasitic capacitance of the node N3 and this causes reduction in amplitude at which the node N3 is stepped up. Then, the driving capability of the transistor Q1D decreases and the rising/falling speed of the carry signal $D_n$ decreases, and the effect of the present invention may be thereby reduced.

Since the step-up capacitor of the node N1 (the gate-channel capacitance of the transistor Q1 and the step-up capacitor C) is larger than the step-up capacitor of the node N3 (the gate-channel capacitance of the transistor Q1D and the step-up capacitor CD), the influence of an increase in parasitic capacitance exerted upon the step-up operation is smaller in the node N1 than in the node N3. Therefore, it is preferable that the input end of the inverter constituted of the transistors Q6 and Q7 should be the node N1.

The Seventh Preferred Embodiment

The seventh preferred embodiment shows a variation of the sixth preferred embodiment (FIG. 15). FIG. 16 is a circuit diagram showing a configuration of a unit shift register SR in accordance with the seventh preferred embodiment. In FIG. 16, elements having the same functions as those of FIG. 15 are represented by the same reference signs. As shown in FIG. 16, though the unit shift register SR of the seventh preferred embodiment has transistors Q8 and Q8D, other than this, the circuit of FIG. 16 is equivalent to the circuit of FIG. 15. The transistor Q8 is connected between the node N1 and the first power supply terminal s1 (VSS) and its gate is connected to the node N2. The transistor Q8D is connected between the node N3 and the first power supply terminal s1 and its gate is connected to the node N2.

In other words, when the nodes N2 and N3 rise to the H level, the transistors Q8 and Q8D are turned on, to discharge the nodes N1 and N3. Therefore, in the unit shift register SR, during a period while the transistors Q1 and Q1D are off (during the non-selection period for the gate line GL), the potentials of the nodes N1 and N3 are fixed to VSS by the transistors Q8 and Q8D.

In the unit shift register SR of the sixth preferred embodiment which does not have the transistors Q8 and Q8D (FIG. 15), there is a possibility that if the clock signal is inputted to the clock terminal CK during a period while the transistors Q1 and Q1D are off, the levels of the nodes N1 and N3 may be raised by the capacitive coupling through the gate-drain overlap capacitances of the transistors Q1 and Q1D. If the levels of the nodes N1 and N3 rise, a current flows in the transistors Q1 and Q1D and this may cause a problem that the gate line driving signal G and the carry signal D unnecessarily rise to the H level during the non-selection period for the gate line GL. On the other hand, the seventh preferred embodiment can prevent the rise in level of the nodes N1 and N3 during the non-selection period for the gate line GL and can thereby suppress the above problem.

The Eighth Preferred Embodiment

The problem discussed in the seventh preferred embodiment that the levels of the nodes N1 and N3 rise during the non-selection period for the gate line GL may be also caused in the unit shift register SR of the first to sixth preferred embodiments. The eighth preferred embodiment suggests a unit shift register SR to take measures against the above problem.

FIG. 17 is a circuit diagram showing a configuration of a unit shift register SR in accordance with the eighth preferred embodiment. In FIG. 17, elements having the same functions as those of FIG. 13 are represented by the same reference signs. As shown in FIG. 17, the unit shift register SR of the eighth preferred embodiment comprises a capacitive element C1 connected between the node N1 and the second clock terminal CK2 and a capacitive element C1D connected between the node N3 and the second clock terminal CK2, and other than this, the circuit of FIG. 17 is equivalent to the circuit of FIG. 13.

Like in the fourth preferred embodiment, the clock signals having different phases are inputted to the first and second clock terminals CK1 and CK2. In the eighth preferred embodiment, however, it is necessary to make a combination in which the timing for the rise of the clock signal inputted to the first clock terminal CK1 is simultaneous with the timing for the fall of the clock signal inputted to the second clock terminal CK2.

Also herein, the unit shift register $SR_n$ of the n-th stage will be discussed as a representative example, and it is assumed that the clock signal CLK is inputted to the first clock terminal CK1 and the clock signal /CLK is inputted to the second clock terminal CK2 in the unit shift register $SR_n$.

In the unit shift register $SR_n$, the transistors Q1 and Q1D are off during the non-selection period for the gate line GL, and when the clock signal CLK of the first clock terminal CK1 rises, the levels of the nodes N1 and N3 are ready to be raised by the coupling through the gate-drain overlap capacitances of the transistors Q1 and Q1D. Since the clock signal /CLK of the second clock terminal CK2 falls, however, the levels of the nodes N1 and N3 are brought down by coupling through the capacitive elements C1 and C1D. In other words, the capacitive elements C1 and C1D so operate as to cancel the rise in level of the nodes N1 and N3 caused by the clock signal CLK.

Therefore, the eighth preferred embodiment can prevent the rise in level of the nodes N1 and N3 during the non-selection period for the gate line GL and can thereby suppress the malfunction in which the gate line driving signal G and the carry signal D unnecessarily rise to the H level during this period.

Though the constitution in which the capacitive elements C1 and C1D are provided in the unit shift register SR of the fourth preferred embodiment (FIG. 13) is shown in FIG. 17, the eighth preferred embodiment can be applied to any of the above-discussed preferred embodiments.

The Ninth Preferred Embodiment

FIG. 18 is a circuit diagram showing a configuration of a unit shift register SR in accordance with the ninth preferred embodiment. In FIG. 18, elements having the same functions as those of FIG. 13 are represented by the same reference signs.

As shown in FIG. 18, in the unit shift register SR of the ninth preferred embodiment, the reset terminal RST (the gates of the transistors Q4 and Q4D) is connected to the second clock terminal CK2, instead of being connected to the unit shift register SR of its succeeding stage. With this connection, a clock signal having a phase different from that of the signal inputted to the first clock terminal CK1 is inputted to the gates of the transistors Q4 and Q4D.

Further, the sources of the transistors Q4 and Q4D are connected to the input terminal IN. With this connection, the gate line driving signal $G_{n-1}$ of the preceding stage is inputted to the sources of the transistors Q4 and Q4D. Since the node N2 is connected to the second clock terminal CK2 in the circuit of FIG. 18, the circuit of FIG. 18 is equivalent to the circuit of FIG. 13 except that the signals inputted to the gates and the sources of the transistors Q4 and Q4D are changed as above.

Also herein, the unit shift register $SR_n$ of the n-th stage will be discussed as a representative example. It is assumed that the clock signal CLK is inputted to the first clock terminal CK1 and the clock signal /CLK is inputted to the second clock terminal CK2 in the unit shift register $SR_n$. Since the operation of the unit shift register SR of the ninth preferred embodiment is basically the same as that in the third preferred embodiment, herein FIG. 10 is referred to again, for simple discussion.

It is assumed that at time $t_1$, the clock signal /CLK inputted to the first clock terminal CK1 in the preceding-stage unit shift register $SR_{n-1}$ rise to the H level and the gate line driving signal $G_{n-1}$ and the carry signal $D_{n-1}$ of the preceding stage are brought into the H level. At that time, though the gates of the transistors Q4 and Q4D in the unit shift register $SR_n$ are brought into the H level, the transistors Q4 and Q4D are not turned on since the sources thereof are also at the H level. Therefore, the nodes N1 and N3 are charged to the H level through the transistors Q3 and Q3D. The unit shift register $SR_n$ thereby changes from the reset state into the set state.

When the clock signal /CLK falls at time $t_2$, though the gate line driving signal $G_{n-1}$ and the carry signal $D_{n-1}$ of the preceding stage are bought into the L level, since the transistors Q3 and Q3D are turned off and the transistors Q4 and Q4D are kept off, the levels of the nodes N1 and N3 are maintained at the H level (VDD-Vth) in the floating state.

When the clock signal CLK rises at time $t_3$, the nodes N1 and N3 are stepped up and the gate line driving signal $G_n$ and the carry signal $D_n$ are brought into the H level (VDD). Then, when the clock signal CLK falls to the L level at time $t_4$, the gate line driving signal $G_n$ and the carry signal $D_n$ of the unit shift register $SR_n$ are also brought into the L level. The nodes N1 and N3 thereby fall to the level of VDD-Vth.

When the clock signal /CLK rises at time $t_5$, since the gate line driving signal $G_{n-1}$ is at the L level, the transistors Q4 and Q4D are turned on and the nodes N1 and N3 are discharged to the L level. In other words, the unit shift register $SR_n$ returns to the reset state and the transistors Q1 and Q1D are turned off. After that, when the clock signal /CLK falls to the L level at time $t_6$, the transistors Q4 and Q4D are turned off again.

Thus, the unit shift register SR of the ninth preferred embodiment can operate in the same manner as the unit shift register SR of the third preferred embodiment operates. In other words, since the transistor Q3 is quickly charged by using the gate line driving signal $G_{n-1}$ and the carry signal $D_{n-1}$ of the preceding stage, the ninth preferred embodiment produces the same effect as that of the third preferred embodiment.

Further, in the ninth preferred embodiment, it is not necessary to connect each unit shift register SR to the succeeding-stage unit shift register. Therefore, the flexibility in circuit layout increases and this advantageously contributes to reduction of the area for forming the circuit. Since the clock signal is continuously supplied to the gates of the transistors Q4 and Q4D, however, it should be noted that the alternating-current power of the clock signal generating circuit (the clock generator 31 of FIG. 8) increases.

Furthermore, though the gate line driving signal G of the preceding stage is inputted to the sources of the transistors Q4 and Q4D of the unit shift register SR in the ninth preferred embodiment, the carry signal D of the preceding stage may be inputted instead. In such a case, however, since the load capacitance on the carry signal output terminal OUTD in each unit shift register SR increases, it should be noted that the rising speed of the carry signal D decreases and the effect of the present invention is slightly reduced.

Though FIG. 18 shows the constitution in which the signal inputted to the gates and the sources of the transistors Q4 and Q4D is changed in the unit shift register SR of the fourth preferred embodiment (FIG. 13), the ninth preferred embodiment can be applied to any of the other preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit comprising:
   a first clock terminal and first and second output terminals;
   a first transistor for supplying a first clock signal inputted to said first clock terminal to said first output terminal;
   a second transistor for discharging said first output terminal;
   a third transistor for supplying said first clock signal to said second output terminal;
   a fourth transistor for discharging said second output terminal;
   a first driving circuit connected to a control electrode of said first transistor, for driving said first transistor;
   a second driving circuit connected to a control electrode of said third transistor, for driving said third transistor;
   said first driving circuit and said second driving circuit perform charge/discharge of said control electrode of said first transistor and charge/discharge of said control electrode of said third transistor, respectively, at the same timing;
   said first driving circuit includes a sixth transistor coupled to said control electrode of said first transistor and discharges said control electrode of said first transistor;
   said second driving circuit includes an eighth transistor coupled to the control electrode of said third transistor and discharges said control electrode of said third transistor; and
   a control electrode of said sixth transistor is connected to a control electrode of said eighth transistor.

2. The shift register circuit according to claim 1, wherein
   a control electrode of said second transistor and a control electrode of said fourth transistor are connected to each other,
   a node connected to said control electrode of said first transistor is a first node,
   a node connected to said control electrodes of said second and fourth transistors is a second node,
   a node connected to said control electrode of said third transistor is a third node,
   said first driving circuit includes
   a fifth transistor having a control electrode connected to a predetermined input terminal, for charging said first node;

said sixth transistor having said control electrode connected to said second node, for discharging said first node, and said second driving circuit includes a seventh transistor having a control electrode connected to said input terminal, for charging said third node; and said eighth transistor having said control electrode connected to said second node, for discharging said third node.

3. The shift register circuit according to claim 2, wherein said first driving circuit further includes a ninth transistor having a control electrode connected to a predetermined reset terminal, for discharging said first node, said shift register circuit further comprising an inverter using said first node as an input end and said second node as an output end.

4. The shift register circuit according to claim 1, further comprising a first capacitive element connected between said control electrode of said first transistor and said first output terminal.

5. The shift register circuit according to claim 1, further comprising a second capacitive element connected between said control electrode of said third transistor and said second output terminal.

6. The shift register circuit consisting of a plurality of shift register circuits according to claim 1 which are connected in cascade.

7. The shift register circuit according to claim 1, wherein a control electrode of said second transistor and a control electrode of said fourth transistor are connected to each other, a node connected to said control electrode of said first transistor is a first node, a node connected to said control electrodes of said second and fourth transistors is a second node, a node connected to said control electrode of said third transistor is a third node, said first driving circuit includes a fifth transistor connected between said first node and a first input terminal, having a control electrode connected to a second input terminal;

said sixth transistor having said control electrode connected to a predetermined reset terminal, for discharging said first node, and said second driving circuit includes a seventh transistor connected between said third node and said first or second input terminal, having a control electrode connected to said second input terminal; and said eighth transistor having said control electrode connected to said predetermined reset terminal, for discharging said third node.

8. The shift register circuit according to claim 7, wherein said second node is connected to said reset terminal.

9. The shift register circuit according to claim 7, wherein said second node is connected to a second clock terminal to which a second clock signal different from said first clock signal in phase is inputted.

10. The shift register circuit according to claim 9, wherein said second transistor is connected between said first output terminal and said first clock terminal, and said fourth transistor is connected between said second output terminal and said first clock terminal.

11. The shift register circuit according to claim 7, further comprising an inverter using said first or third node as an input end and said second node as an output end.

12. The shift register circuit according to claim 11, further comprising:

a ninth transistor having a control electrode connected to said second node, for discharging said first node; and a tenth transistor having a control electrode connected to said second node, for discharging said third node.

13. The shift register circuit according to claim 7, further comprising:

a first capacitive element connected between a third clock terminal to which a third clock signal different from said first clock signal in phase is inputted and said first node; and a second capacitive element connected between said third clock terminal and said third node.

14. The shift register circuit which is a multistage shift register circuit, each stage of which is the shift register circuit according to any one of claims 7 to 13, wherein in said each stage, said first input terminal is connected to said first output terminal of its preceding stage, said second input terminal is connected to said second output terminal of its preceding stage, and said reset terminal is connected to said first output terminal of its succeeding-stage.

15. The shift register circuit according to claim 14, wherein in said each stage, an output signal from said second output terminal is faster in speed of level change than an output signal from said first output terminal.

16. The shift register circuit according to any one of claims 7 to 13, wherein said sixth transistor is connected between said first node and said first or second input terminal, said eighth transistor is connected between said third node and said first or second input terminal, and a fourth clock signal different from said first clock signal in phase is inputted to said reset terminal.

17. The shift register circuit which is a multistage shift register circuit, each stage of which is the shift register circuit according to claim 16, wherein in said each stage, said first input terminal is connected to said first output terminal of its preceding stage, said second input terminal is connected to said second output terminal of its preceding stage, and said fourth clock signal has the same phase as that of a signal inputted to said first clock terminal of its preceding stage.

18. The shift register circuit according to claim 17, wherein in said each stage, an output signal from said second output terminal is faster in speed of level change than an output signal from said first output terminal.

19. An image display apparatus comprising a gate line driving circuit formed of a multistage shift register circuit, wherein each stage of said multistage shift register circuit comprises a first clock terminal and first and second output terminals;

a first transistor for supplying a first clock signal inputted to said first clock terminal to said first output terminal;

a second transistor for discharging said first output terminal;

a third transistor for supplying said first clock signal to said second output terminal;

a fourth transistor for discharging said second output terminal;

a first driving circuit connected to a control electrode of said first transistor, for driving said first transistor;

a second driving circuit connected to a control electrode of said third transistor, for driving said third transistor;

said first driving circuit and said second driving circuit perform charge/discharge of said control electrode of said first transistor and charge/discharge of said control electrode of said third transistor, respectively, at the same timing;

said first driving circuit includes a sixth transistor coupled to said control electrode of said first transistor and discharges said control electrode of said first transistor;

said second driving circuit includes an eighth transistor coupled to the control electrode of said third transistor and discharges said control electrode of said third transistor; and a control electrode of said sixth transistor is connected to a control electrode of said eighth transistor.

20. The image display apparatus according to claim 19, wherein in said each stage, said first output terminal is connected to a gate line of a display panel, and said second output terminal is connected to a input terminal of its succeeding-stage shift register circuit.

21. The image display apparatus according to claim 19, wherein in said each stage, a control electrode of said second transistor and a control electrode of said fourth transistor are connected to each other, a node connected to said control electrode of said first transistor is a first node, a node connected to said control electrodes of said second and fourth transistors is a second node, a node connected to said control electrode of said third transistor is a third node, said first driving circuit includes a fifth transistor connected between said first node and a first input terminal, having a control electrode connected to a second input terminal; and said sixth transistor having said control electrode connected to a predetermined reset terminal, for discharging said first node, and said second driving circuit includes a seventh transistor connected between said third node and said first or second input terminal, having a control electrode connected to said second input terminal; and said eighth transistor having said control electrode connected to said predetermined reset terminal, for discharging said third node.

22. The image display apparatus according to claim 21, wherein in said each stage, said first input terminal is connected to said first output terminal of its preceding stage, said second input terminal is connected to said second output terminal of its preceding stage, and said reset terminal is connected to said first output terminal of its succeeding-stage, and wherein each of gate lines of a display panel is connected to said first output terminal of said each stage.

23. The image display apparatus according to claim 22, wherein in said each stage, an output signal from said second output terminal is faster in speed of level change than an output signal from said first output terminal.

24. The image display apparatus according to claim 21, wherein in said each stage, said sixth transistor is connected between said first node and said first or second input terminal, said eighth transistor is connected between said third node and said first or second input terminal, said first input terminal is connected to said first output terminal of its preceding stage, said second input terminal is connected to said second output terminal of its preceding stage, and a fourth clock signal having the same phase as that of a signal inputted to said first clock terminal of its preceding stage is inputted to said reset terminal, and wherein each of gate lines of a display panel is connected to said first output terminal of said each stage.

25. The image display apparatus according to claim 24, wherein in said each stage, an output signal from said second output terminal is faster in speed of level change than an output signal of said first output terminal.

* * * * *